US006219049B1

United States Patent
Zuffante et al.

(10) Patent No.: US 6,219,049 B1
(45) Date of Patent: Apr. 17, 2001

(54) MATE INFERENCING

(75) Inventors: Robert P. Zuffante, Newton; John K. Hirschtick, Winchester, both of MA (US); Boris Shoov, Nashua, NH (US); David Corcoran, Lexington, MA (US); Mick Kallman, Cambridge (GB); Michael Payne, Concord, MA (US); Linda Lokay, Durham, NC (US)

(73) Assignee: Solidworks Corporation, Concord, MA (US)

( * ) Notice: Subject to any disclaimer, the term of this patent is extended or adjusted under 35 U.S.C. 154(b) by 0 days.

(21) Appl. No.: 09/162,592

(22) Filed: Sep. 29, 1998

Related U.S. Application Data

(63) Continuation-in-part of application No. 08/574,629, filed on Dec. 20, 1995, now Pat. No. 5,815,154.

(51) Int. Cl.[7] .............................. G06F 3/14; G06F 17/50
(52) U.S. Cl. .................. 345/339; 345/964; 345/420; 700/103; 700/104; 706/919
(58) Field of Search ................................. 345/420, 964, 345/967, 339, 355, 419, 356, 145, 346, 352, 353, 357; 364/468.03, 468.04, 468.09, 468.1, 478.07, 478.08; 434/367, 369; 706/919, 920; 700/97, 98, 103, 104, 219, 220

(56) References Cited

U.S. PATENT DOCUMENTS

| 5,006,991 | * | 4/1991 | Ohcoshi et al. | 345/420 X |
| 5,165,015 | * | 11/1992 | Coggins | 345/356 |
| 5,293,479 | * | 3/1994 | Quintero et al. | 706/919 X |
| 5,367,622 | | 11/1994 | Coggins | 345/356 |
| 5,586,052 | * | 12/1996 | Iannuzzi et al. | 364/468.03 X |
| 5,619,630 | * | 4/1997 | Minami et al. | 345/356 X |
| 5,754,738 | | 5/1998 | Saucedo et al. | 706/11 |
| 5,905,501 | * | 5/1999 | Kato | 345/420 |

FOREIGN PATENT DOCUMENTS

WO 97/22952   6/1997   (WO).

* cited by examiner

Primary Examiner—Raymond J. Bayerl
(74) Attorney, Agent, or Firm—Foley, Hoag & Eliot LLP

(57) ABSTRACT

A dynamic mate inferencing system permits display and manipulation of a computer model, including features of allowing a user to select a feature of the model, determining a characteristic geometry of the feature, dynamically previewing the mating of the feature to a component of the model, allowing the user to alternate between different mating scenarios, and permitting the user to mate the feature to the component in the previewed geometry.

12 Claims, 34 Drawing Sheets

Fig. 20A

| | | | |
|---|---|---|---|
| File Edit View Insert Tools Window | | | |
| Rigging Yoke | | | |
| Plane 1 | 38,474 | 11/11/95 | 6:50:06 PM |
| Plane 2 | 4,988 | 11/24/95 | 2:00:34 PM |
| Plane 3 | 14,336 | 11/12/95 | 5:24:08 PM |
| Rear Body | 382,976 | 11/11/95 | 7:23:48 PM |
| Front Body | 11,264 | 11/24/95 | 1:54:42 PM |
| Rear Boss | 5,840 | 8/28/95 | 9:26:22 AM |
| Front Boss | 0 | 11/24/95 | 4:07:52 PM |
| Rear Cut | 41,181 | 11/24/95 | 10:38:30 AM |
| Front Cut | 415,232 | 11/11/95 | 7:51:50 PM |
| Front Axis | 17,408 | 11/11/95 | 7:23:34 PM |
| Rear Axis | 11,776 | 11/12/95 | 5:33:52 PM |
| Front Drill | 7,680 | 11/24/95 | 10:17:18 AM |
| Rear Drill | 154,199 | 11/24/95 | 10:19:22 AM |
| Fillets | 22,016 | 11/25/95 | 12:33:48 PM |

| | | | |
|---|---|---|---|
| File Edit View Insert Tools Window | | | |
| Rigging Yoke | | | |
| Plane 1 | 0 | 11/24/95 | 4:07:52 PM |
| Plane 2 | 4,988 | 11/24/95 | 2:00:34 PM |
| Plane 3 | 5,840 | 8/28/95 | 9:26:22 AM |
| Rear Body | 7,680 | 11/24/95 | 10:17:18 AM |
| Front Body | 11,264 | 11/24/95 | 1:54:42 PM |
| Rear Boss | 11,776 | 11/12/95 | 5:33:52 PM |
| Front Boss | 14,336 | 11/12/95 | 5:24:08 PM |
| Rear Cut | 17,408 | 11/11/95 | 7:23:34 PM |
| Front Cut | 22,016 | 11/25/95 | 12:33:48 PM |
| Front Axis | 38,474 | 11/11/95 | 6:50:06 PM |
| Rear Axis | 41,181 | 11/24/95 | 10:38:30 AM |
| Front Drill | 154,199 | 11/24/95 | 10:19:22 AM |
| Rear Drill | 382,976 | 11/11/95 | 7:23:48 PM |
| Fillets | 415,232 | 11/11/95 | 7:51:50 PM |

140 ← 142  143  144

MATE INFERENCING

CROSS REFERENCE TO RELATED APPLICATION

This application is a continuation-in-part of U.S. utility patent application Ser. No. 08/574,629, filed Dec. 20, 1995, entitled GRAPHICAL BROWSER SYSTEM FOR DISPLAYING AND MANIPULATING A COMPUTER MODEL now issued as U.S. Pat. No. 5,815,154. That patent application and all other patents and patent applications identified herein are hereby incorporated by reference.

TECHNICAL FIELD

This application relates to the field of computer-aided design and more particularly to the field of accessing and manipulating data describing a model constructed using computer-aided design.

BACKGROUND OF THE INVENTION

Computer-aided design software can be used to construct and manipulate computer drawings of objects referred to as "models". The user is presented with a display of the model on the computer screen and manipulates the model using keyboard commands, a mouse/cursor combination, and other various input means. Changes to the model are reflected in the screen display of the model as the user makes the changes or, alternatively, in response to the user issuing a specific command to update the screen display of the model. In either case, the screen display of the model serves as the main source of model information to the user and as the user's reference for inputting and changing features of the model.

As modeling software becomes more powerful, it also becomes more complex. This increase in complexity increases the difficulty of use of the modeling software. If the software becomes too complex, then the user will have a difficult time making modifications and/or determining critical information about the model, especially since the screen display of the model is the user's main source of information and point of reference for facilitating input. This problem becomes more acute when the model is a three-dimensional model since, depending on the modeling software and the nature of the model, it is sometimes difficult, if not impossible, to see the entirety of the model at any one time.

One way to address the increasing complexity of modeling software is to provide alternatives to the traditional techniques for presenting the model information to the user that allow the user to manipulate the model information. U.S. Pat. No. 5,006,991 to Ohcoshi et al. discloses a system for graphically checking interference between stationary and moving objects. A design layout is graphically displayed and an object or a person is moved through the design layout by the graphical display device. Column 9, lines 64–66 indicate that along with displaying the design layout, the system can display a chart showing connections and positions of objects in the design layout.

Although the Ohcoshi et al. patent addresses a specific problem associated with modeling in the specific situation discussed in the patent, it does not address the general problem of modeling software complexity and unwieldiness and it does not provide a general alternative technique for accessing and manipulating models. Accordingly, it is desirable to provide an alternative and effective technique for presenting and manipulating model data that allows the user to easily make changes to a model and that presents model information to the user that is useful although not apparent from simply viewing the model on the screen display.

SUMMARY OF THE INVENTION

According to the present invention, a graphical browser displays and manipulates a computer model by accessing data indicative of features and geometric characteristics of the model, presents graphical data indicative of features of the model, and allows a user to graphically manipulate features to provide corresponding changes to the model. The data may be accessed by interfacing to feature data and geometric data of the model. Different icons, indicative of different types of features of the model, may be displayed. The icons may be ordered and connected to indicate an order of creation of features of the model. The icons may be presented in a way to indicate interdependency of features.

Graphically manipulating the features may include altering the ordering of the features of the model, selectively suppressing certain ones of the features, or rolling back the model to a particular feature, so that that particular feature and subsequent features are suppressed. Graphically manipulating the features may also include stepping through each feature of the model, one at a time, to unsuppress each feature on the model, one at a time. Presenting graphical data may also include presenting various alignment features of the model.

According further to the present invention, a computer-aided design system for displaying and manipulating a computer model presents the computer model in a modeling portion of a computer screen, presents graphical data indicative of features of the model in a graphical browser portion of the computer screen, highlights a subset of the modeling portion in response to a user selecting a corresponding subset of the graphical browser portion, and highlights a subset of the graphical browser portion in response to the user selecting a corresponding subset of the modeling portion.

The graphical browser provides the user with a powerful technique for creating and editing models. In the case of three dimensional models, the graphical browser provides the user with simultaneous access to all of the features of the model even if all of the model features cannot be seen all at the same time in a screen display of the model. The data manipulation features of the graphical browser allow the user to easily enter and edit model data in ways that would be difficult or cumbersome if the user were forced to use only the screen display of the model as an input reference.

Provided herein is a system for displaying and manipulating a computer model, which may include data accessing means, for accessing data indicative of features and geometric characteristics of the model, feature selection means, coupled to said data accessing means, for allowing a user to select a feature of the model, and determination means, for determining a characteristic geometry of a feature. The system may also include preview means, coupled to the feature selection means and data accessing means, for previewing the mating of the feature to a component of the model based on the characteristic geometry of the feature.

Provided herein is a method of displaying and manipulating a computer model, including allowing a user to select a feature of the model and determining a characteristic geometry of the feature. The method may also include dynamically previewing the mating of the feature to a component of the model. The user may be permitted to select among different mating scenarios between the feature and the component.

Provided herein is a method of displaying and manipulating a computer model, including allowing a user to select a feature of the model, determining a characteristic geometry of the feature, dynamically previewing the mating of the feature to a component of the model, allowing the user to alternate between different mating scenarios, and permitting the user to mate the feature to the component in the previewed geometry.

BRIEF DESCRIPTION OF DRAWINGS

FIGS. 20A and 20B are windows illustrating a sorting option of the graphical browser using various criteria for sorting.

DETAILED DESCRIPTION OF THE PREFERRED EMBODIMENTS

Figure 1:
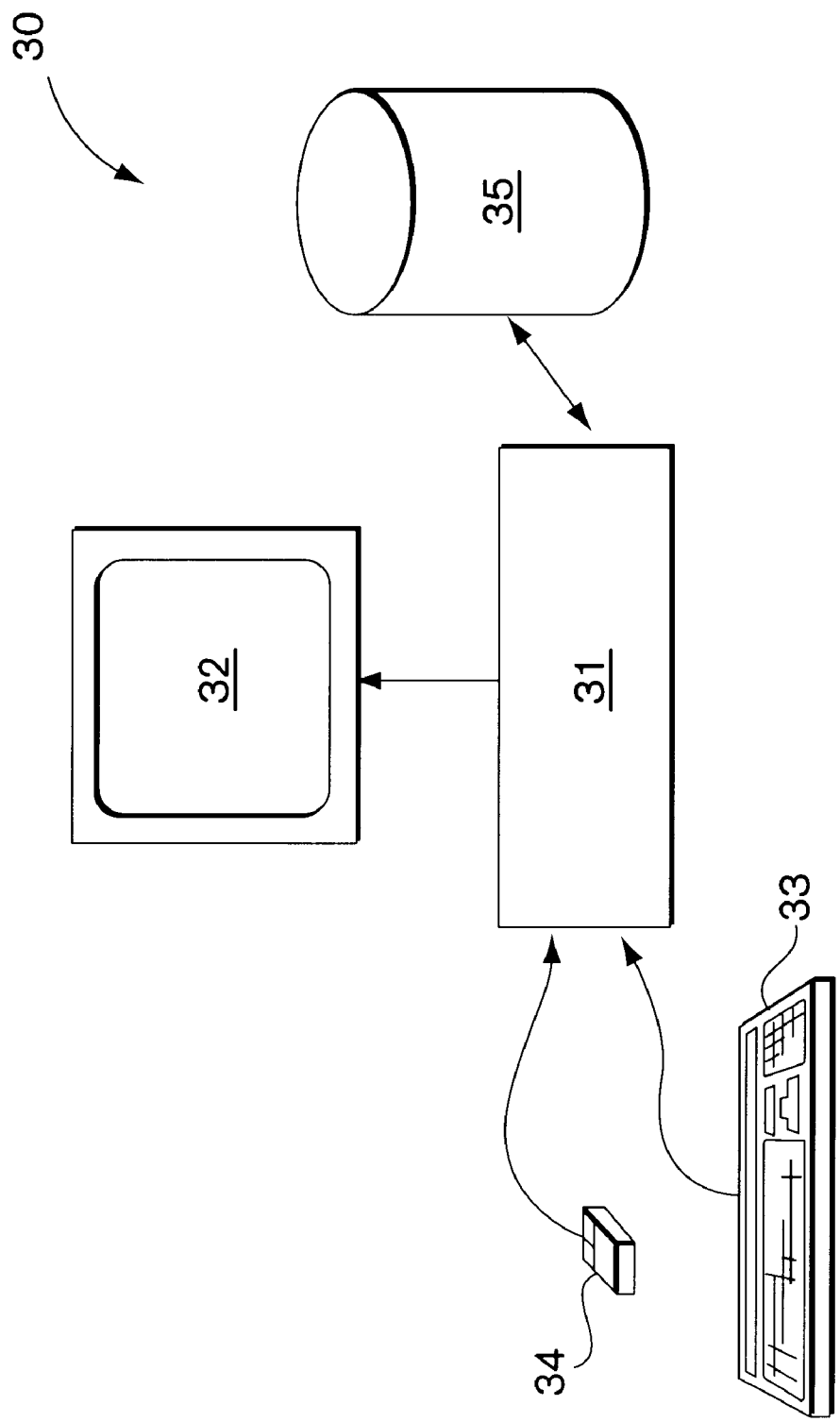
FIG. 1 is a schematic diagram of a computerized modeling system used to provide computer-aided design and to provide the graphical browser according to the present invention.

Referring to FIG. 1, a computerized modeling system 30 includes a CPU 31, a CRT 32, a keyboard input device 33, a mouse input device 34, and a storage device 35. The CPU 31, CRT 32, keyboard 33, mouse 34, and storage device 35 are conventional, commonly available, computer hardware devices such as an Alpha-based computer such as those provided by Digital Equipment Corporation of Maynard, Mass or a Pentium-based computer. The mouse 34 has conventional, user-actuatable, left and right buttons. Other appropriate computer hardware platforms are suitable as will become apparent from the discussion which follows. such computer hardware platforms are preferably capable of operating the Microsoft Windows NT, Windows 95, or Windows 98 operating systems.

Computer-aided design software is stored on the storage device 35 and is loaded into and executed by the CPU 31. The software allows the user to create and modify a three-dimensional model. The CPU 31 uses the CRT 32 to display a three-dimensional model and other aspects thereof as described in more detail below. A user actuates the keyboard 33 and the mouse 34 to enter and modify data for the three-dimensional model. The CPU 31 accepts and processes input from the keyboard 33 and the mouse 34. Using the three-dimensional modeling software, the CPU 31 processes the input along with the data associated with the three-dimensional model and makes corresponding and appropriate changes to the display on the CRT 32. In addition, data corresponding to the three-dimensional model created by the user can be written from the CPU 31 to the storage device 35. Although the remainder of the discussion relates to use of the invention with computer-aided design software for providing three-dimensional models, it will be appreciated by those of ordinary skill in the art that the invention could also be used in conjunction with any computer-aided design software, including software used to generate two-dimensional models.

Figure 2:
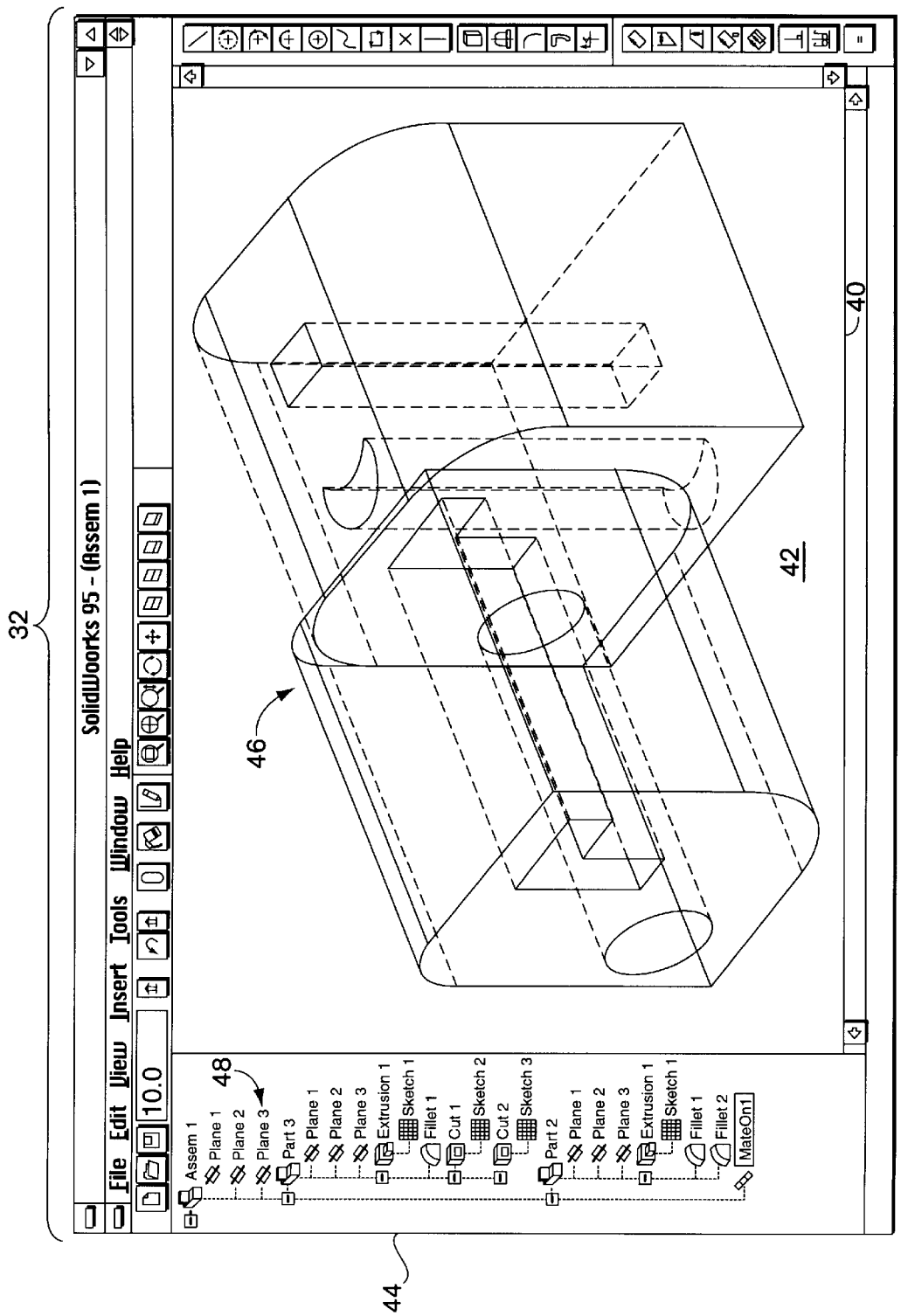
FIG. 2 illustrates a CAT display of the system of FIG. 1 showing a modeling portion and a browser portion of a CAT display window.

Referring to FIG. 2, a display on the CRT 32 is shown in detail and includes a window 40. The window 40 is a conventional screen display window which can be programmed by one of ordinary skill in the art using conventional, commercially available, software programming tools, such as those available from Microsoft Corporation of Redmond, Wash.

The window 40 includes two portions, a modeling portion 42 and a graphical browser portion 44. The modeling portion 42 contains a three-dimensional model 46 that can be constructed and modified by the user in a conventional manner. The three-dimensional model 46 can be displayed in a conventional manner using solid lines and dashed lines to show visible edges and hidden edges, respectively, of the three-dimensional model. The graphical browser portion 44 aids visualization and manipulation of the model portion 42. As described in more detail below, the graphical browser portion 44 can be used to visualize and/or edit feature types, names, model structure, relationships between features, order, dates of creation and modification of features, feature suppression, feature visibility and other similar attributes of the model 46. It should be understood that certain embodiments of the invention, such as the mate inferencing embodiments disclosed herein, may be accomplished with or without the graphical browser portion 44. That is, such embodiments can be accomplished in any system that includes a graphical window for displaying a model 46, such as, for example, the model portion 42.

The graphical browser portion 44 shows a list of features 48 containing aspects or components of the three-dimensional model 46. The features 48 are represented in a way that illustrates that certain ones of the features 48 are in fact comprised of lower-level features. For example, the feature labeled "Part3" on FIG. 2 is comprised of the features labeled "Plane1", "Plane2", "Plane3", "Extrusion1", "Fillet1", "Cut1", and "Cut2". In addition, the feature labeled "Extrusion1" is further comprised of a subfeature labeled "Sketch1" and the subfeatures labeled "Cut1" and "Cut2" are further comprised of subfeatures labeled "Sketch1" and "Sketch2", respectively. The features of the feature list 48 are ordered from top to bottom to show the order of entry by the user.

Figure 3:
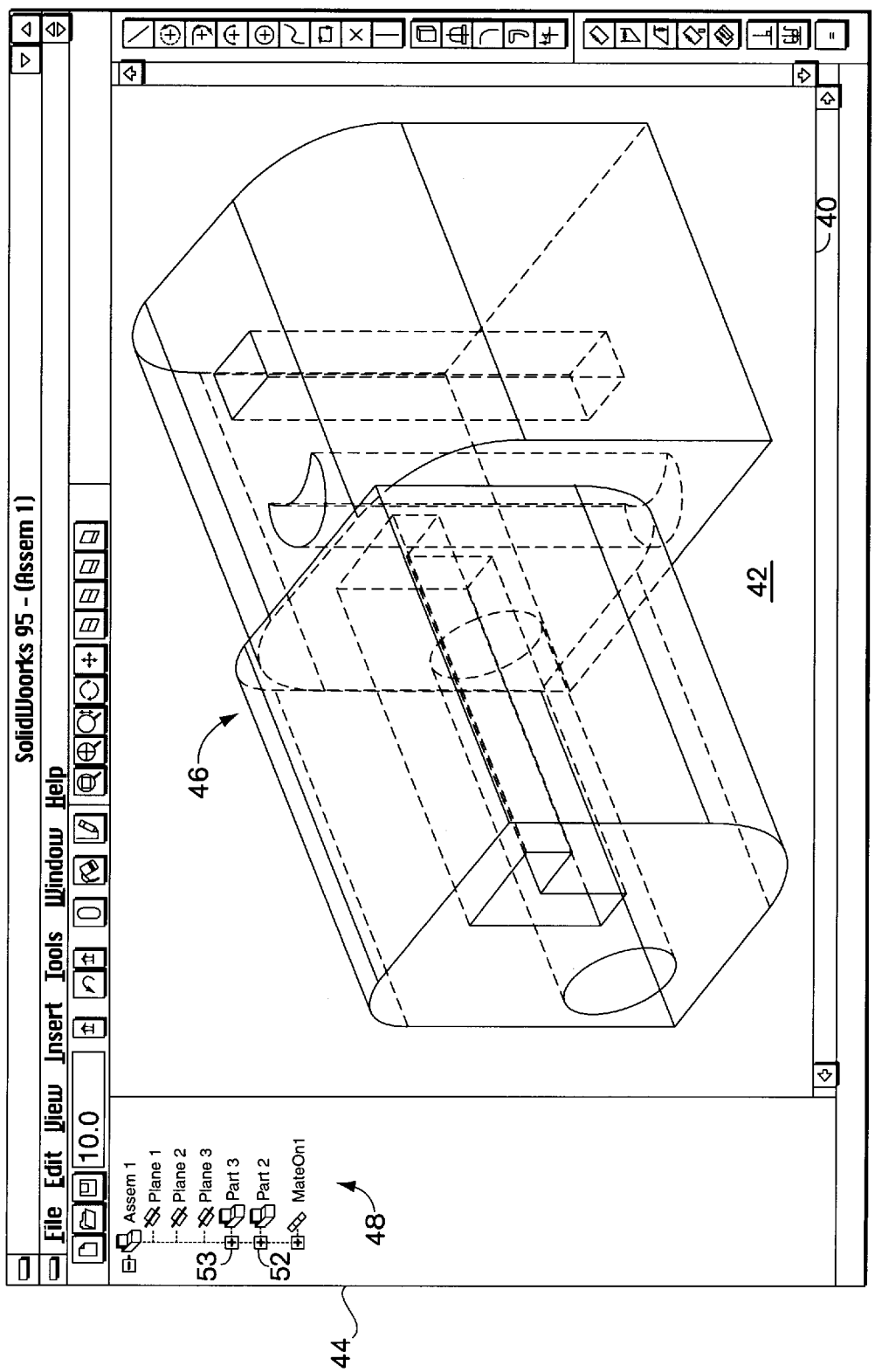
FIG. 3 illustrates the window of FIG. 2 with hidden subfeatures of the features screen in the browser portion.

Referring to FIG. 3, the window 40 shows the features list 48 with the subfeatures thereof hidden. In that case, note that the feature labeled "Part2" is connected with a horizontal line to a box 52 having a plus sign therein and the feature labeled "Part3" is connected with a horizontal line to a box 53 having a plus sign therein. The plus signs in the boxes 52,53 indicate that particular features attached thereto via a horizontal line are actually comprised of one or more subfeatures that are not shown in the feature list 48. The user can modify the feature list 48 of FIG. 3 to provide the detailed feature list 48 as shown in FIG. 2 by using the mouse 34 to click on the boxes 52, 53. Once the features have been expanded to the subfeatures thereof, the boxes 52,53 contain a minus sign indicating that the features have been expanded, as shown in FIG. 2.

Figure 4A:
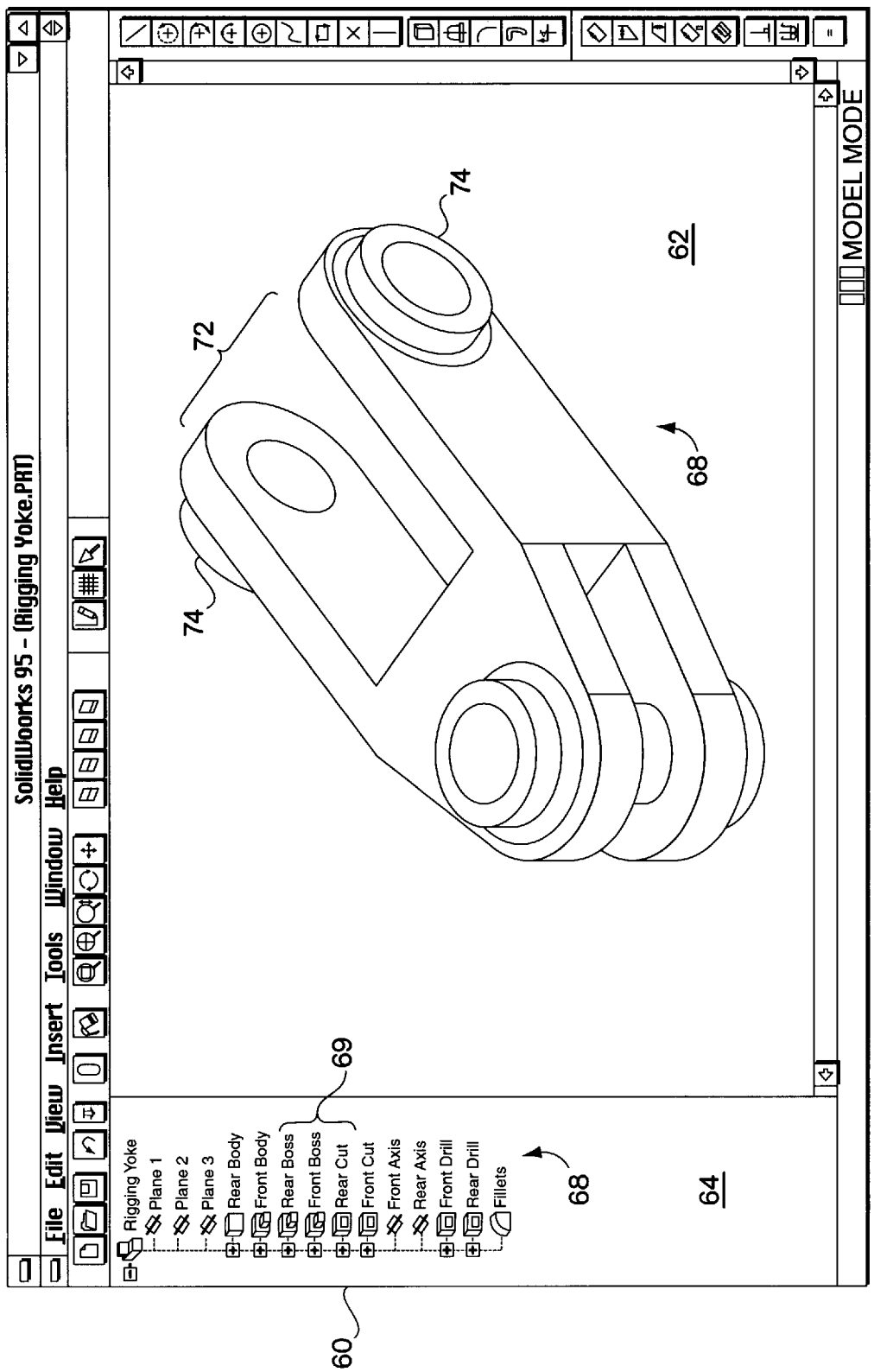
FIG. 4A is a window showing a first model portion and a first browser portion.
Figure 4B:
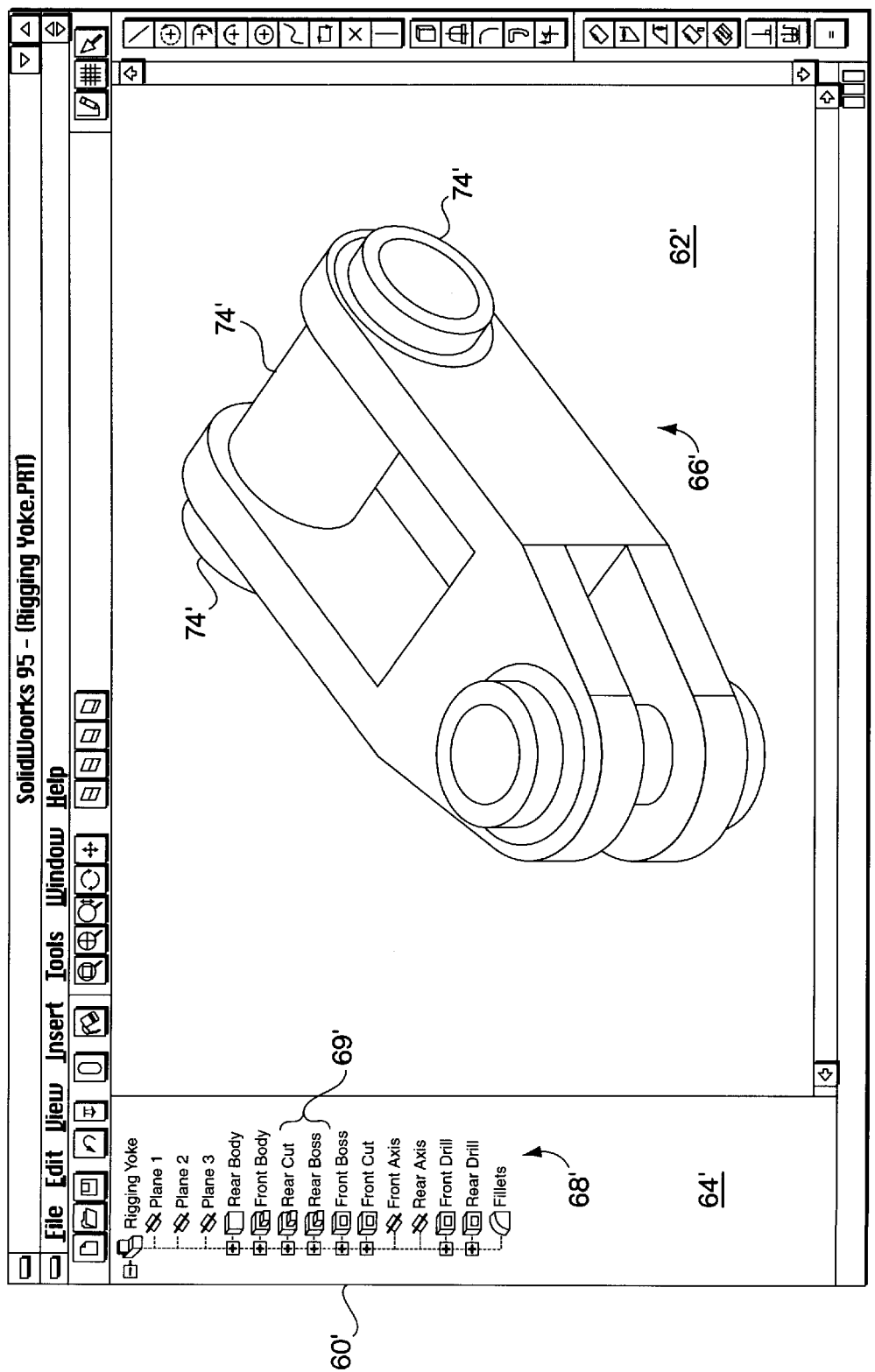
FIG. 4B is a window showing a second model portion and a second browser portion.

FIG. 4A and FIG. 4B illustrate the effects of changing the order of features in a feature list. FIG. 4A shows a window 60 having two portions, a modeling portion 62 and a graphical browser portion 64. The modeling portion 62 contains a three-dimensional model 66 that is constructed and modified by the user. The graphical browser portion 64 includes a feature list 68 showing aspects and components of the model 66. Similarly, FIG. 4B shows a window 6' having a modeling portion 62' and a graphical browser portion 64' wherein the model portion 62' includes a three-dimensional model 66' and the graphical browser portion 64' includes a feature list 68' showing aspects and components of the model 66'.

A portion 69 of the feature list 68 shows two features labeled "Rear Boss" and "Rear Cut". In the feature list 68 of FIG. 4A, the Rear Boss feature precedes (i.e., is higher than) the Rear Cut feature. Accordingly, a rear portion 72 of the model 66 shows a rear boss 74 that has been cut in the middle thereof by the Rear Cut feature. Therefore, the rear boss 74 of the model 66 is in two separate parts, one on each lateral side of the model 66.

The feature list 68' also has a section 69' containing features labeled "Rear Cut" and "Rear Boss". However, in the case of the feature list 68' of FIG. 4B, the section 69' shows that the Rear Cut feature precedes (i.e., is higher than) the Rear Boss feature. Accordingly, a rear portion 72' of the model 66' shows a rear boss 74' that has not been cut, but instead, extends continuously from one lateral side of the model 66' to the other lateral side of the model 66'. This occurs because the order of features shown in the section 69' indicates that the rear cut is performed prior to adding the boss 74' to the model 66'. Therefore, the rear cut, which comes before the addition of the rear boss 74', has no effect on the rear boss 74' in the model 66'.

The section 69 of the feature list 68 in FIG. 4A is modified to provide the section 69' of the feature list 68' of FIG. 4B using a technique called "drag and drop". Drag and drop is a conventional technique that involves using the mouse 34 to move an icon associated with a feature to a different location in the feature list. The user places the mouse cursor over the icon of the feature to be moved, clicks and holds down the left button of the mouse 34 while moving the mouse cursor and the feature icon to the desired location, and then releases the button of the mouse 34. Alternatively, the user can achieve the same results by employing a similar conventional technique, called "cut and paste", to highlight one or more icons, execute a "cut" or "copy" operation, select an insertion location, and execute a "paste" operation. Implementation of the drag and drop option and the cut and paste option is described in more detail hereinafter.

Note that the section 69 of the feature list 68 in FIG. 4A can be modified in one of two ways to provide the section 69' of the feature list 68' in FIG. 4B. The user can use the mouse 34 to drag and drop (or cut and paste) the Rear Cut feature so that it precedes the Rear Boss feature as shown in the section 69'. Alternatively, the user can use the mouse 34 to drag and drop (or cut and paste) the Rear Boss feature so that it comes after the Rear Cut feature as shown in the section '69'.

Figure 5:
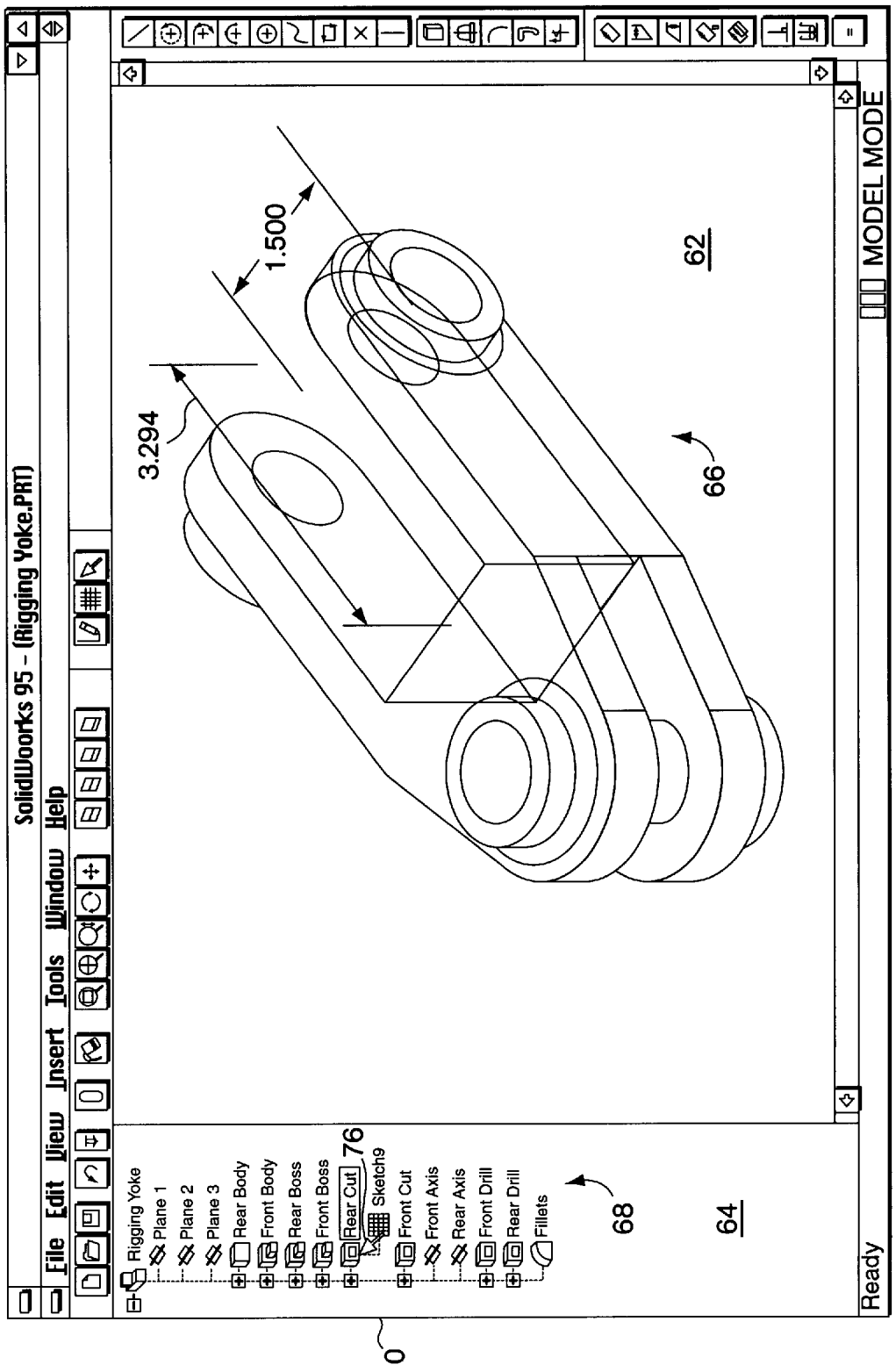
FIG. 5 is a window showing a model portion and a model portion with a model having dimensions thereon.

Referring to FIG. 5, the rear cut feature discussed above in connection with FIGS. 4A and 4B is shown in an expanded form as being comprised of a subfeature labeled "Sketch9". Note that the feature list 68 of FIG. 5 shows a box connected to the left of the Rear Cut feature containing a minus sign rather than a plus sign, as shown in FIGS. 4A and 4B. As discussed above in connection with FIGS. 2 and 3, the minus sign in the box indicates that the feature connected thereto has been expanded to show subfeatures thereof.

A cursor arrow 76 is moved by using the mouse 34 in a conventional manner so that the end of the cursor arrow is coincident with an icon portion of the Rear Cut feature in the feature list 68. Once the cursor arrow 76 is placed on the icon for the Rear Cut feature, the user can double click the left button of the mouse 34 to modify the modeling portion 62 so that dimensions of the Rear Cut feature are superimposed onto the three-dimensional model 66. Once the dimensions are visible, the user can double click the left button of the mouse 34 to modify the dimensions. In a similar manner, moving the cursor arrow 76 onto the icon of other ones of the features from the feature list 68 and double clicking the left button of the mouse 34 will modify the drawing portion 62 to superimpose dimensions of the associated feature onto the model 66 or to perform some other appropriate action, as described in more detail hereinafter. A single click of the left button of the mouse 34 will highlight the feature from the feature list 68 and highlight the corresponding portion of the drawing 66.

Figure 6:
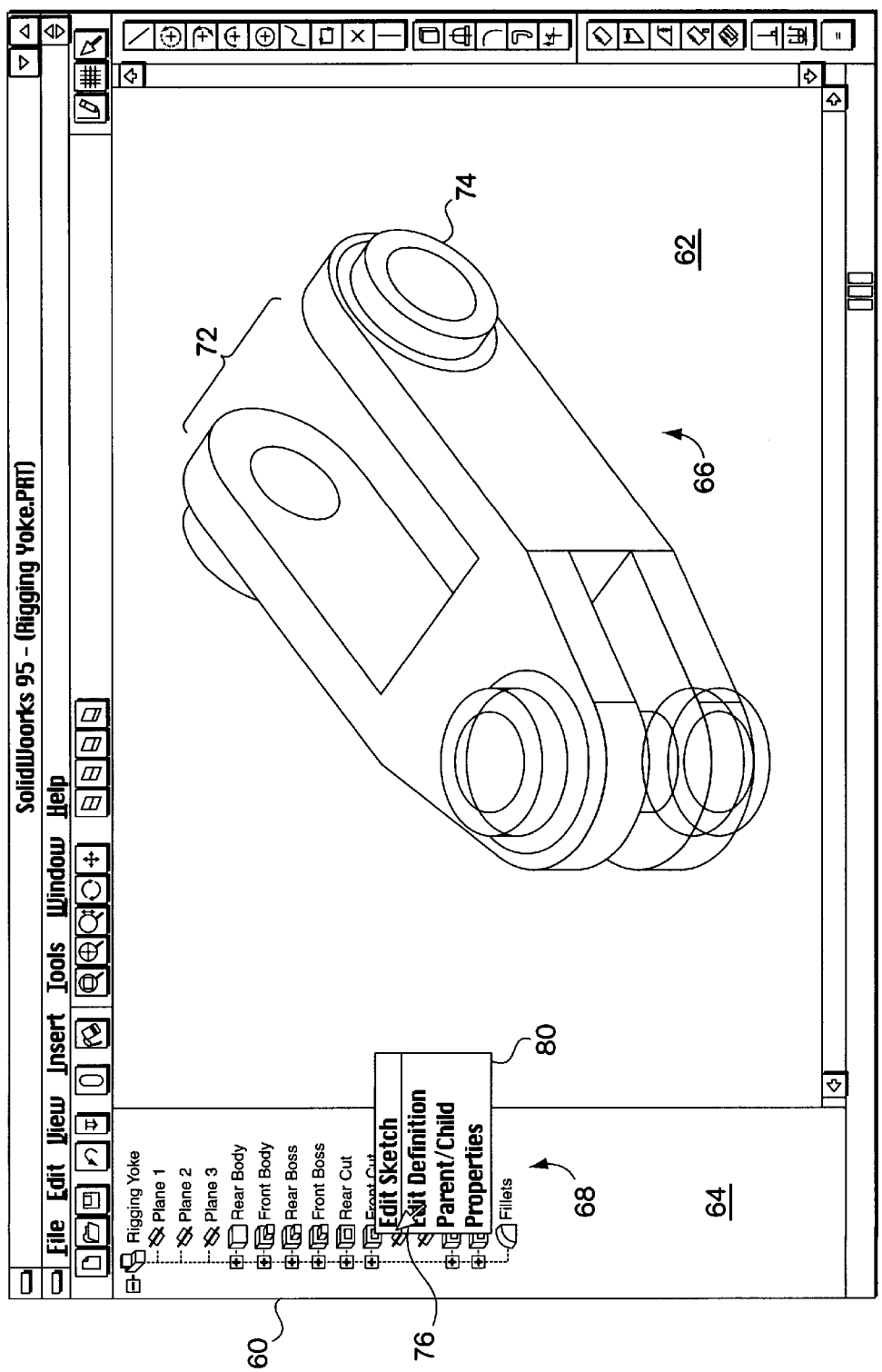
FIG. 6 is a window showing a model portion and a browser portion with a first pop-up menu superimposed thereon.

Referring to FIG. 6, a conventional pop-up menu 80 is provided by clicking the right button of the mouse 34 when the cursor 76 is placed on a particular one of the features from the feature list 68. The pop-up menu 80 of FIG. 6 results when the right button of the mouse 34 is clicked while the cursor 76 is placed on the Rear Cut feature. The pop-up menu 80 shows various options including an Edit Sketch option, an Edit Definition option, a Parent/Child option, and a Properties option. The user can select one of the options of the pop-up menu 80 in a conventional manner using the mouse cursor 76 and the right button of the mouse 34.

Figure 7:
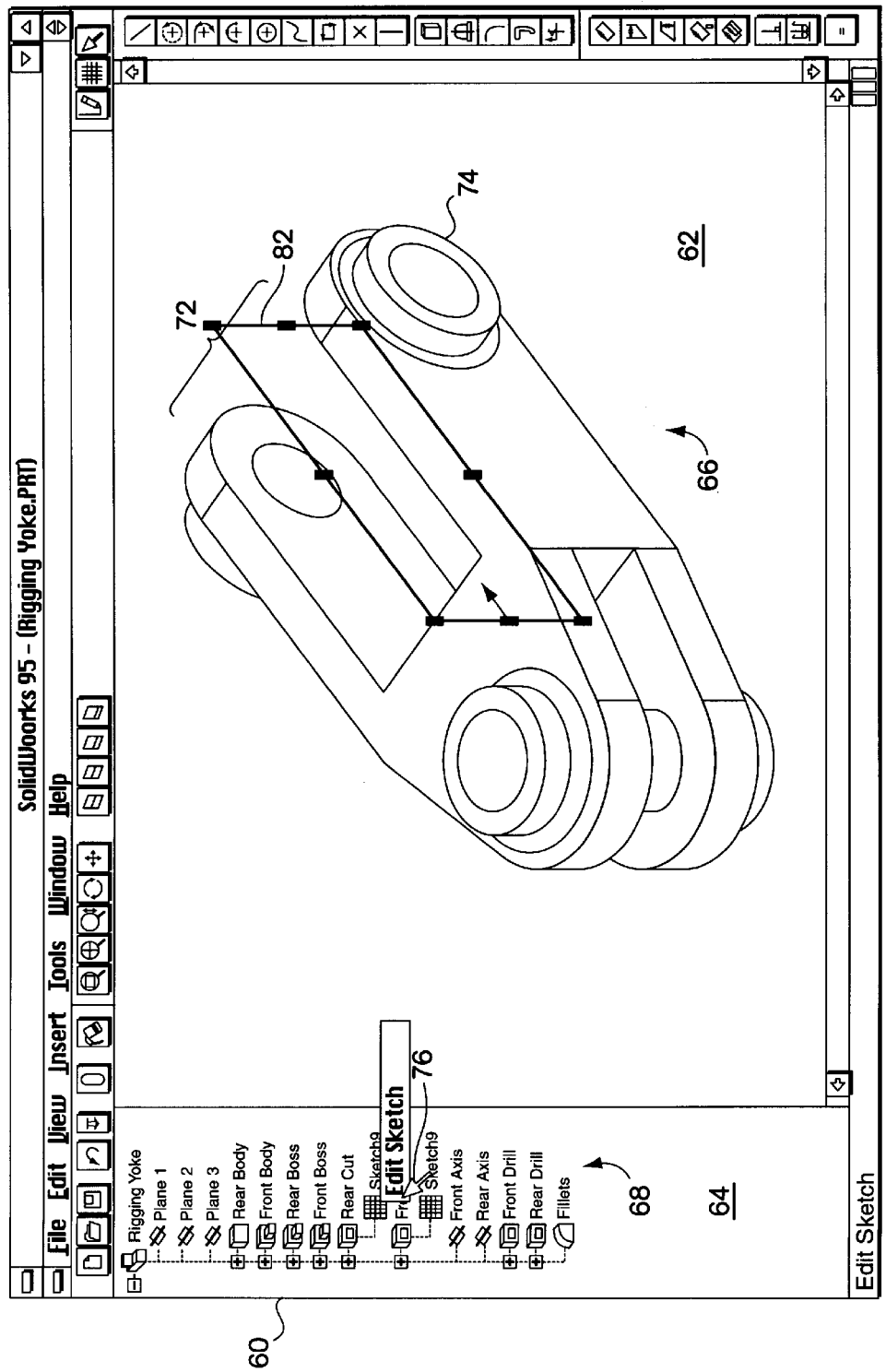
FIG. 7 is a window showing a model portion and a browser portion and illustrating a first option of the first pop-up menu.

Referring to FIG. 7, the effect of selecting the Edit Sketch option of the pop-up menu 80 of FIG. 6 is illustrated. Note that the rear cut 72 in the model 66 is made by first providing a sketch 82 and removing material in the model 66 corresponding to the sketch 82 projected a finite distance along a perpendicular axis thereof. Accordingly, selecting the edit sketch option shows the sketch 82 used to make the rear cut in the model 66. Once this option is selected, the user can modify the dimensions of the sketch 82 by moving the cursor 76 to selected points of the sketch 82 and shrinking or enlarging one or more dimensions of the sketch 82 in a conventional manner. Note that modifying the sketch 82 could change the location and amount of material removed from the model 66 by the Rear Cut feature.

Figure 8:
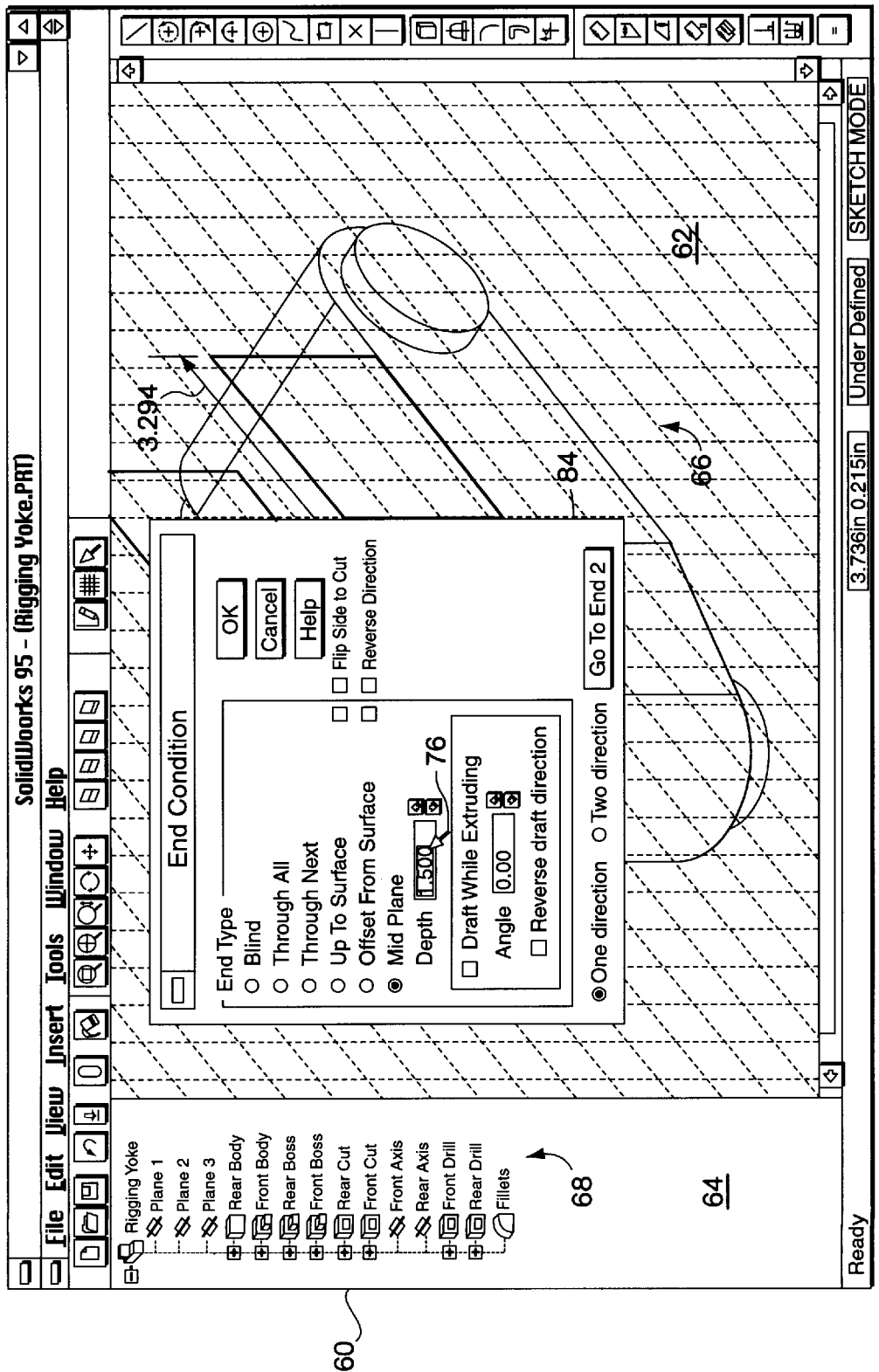
FIG. 8 is a window showing a model portion and a browser portion and illustrating a second option of the first pop-up menu.

Referring to FIG. 8, a window 84 is presented when the user selects the edit definition option from the pop-up menu 80 shown in FIG. 6. The window 84 shows various parameters that are part of the definition of the Rear Cut feature. Different types of features will show different types of windows when the edit definition feature is selected. The specific parameters that are provided for each type of feature is a design choice based on a variety of functional factors familiar to one of ordinary skill in the art.

The user can interact with the window 84 to modify elements therein in a conventional manner using the mouse 34 and/or the keyboard 33. For example, the user can modify the Depth element of the window 84 by pressing the right button of the mouse 34 and dragging the cursor 76 over the text associated with the Depth element to highlight the text as shown in FIG. 8. Afterward, the user can use the keyboard 33 to type in a new value for the Depth element.

Figure 9:
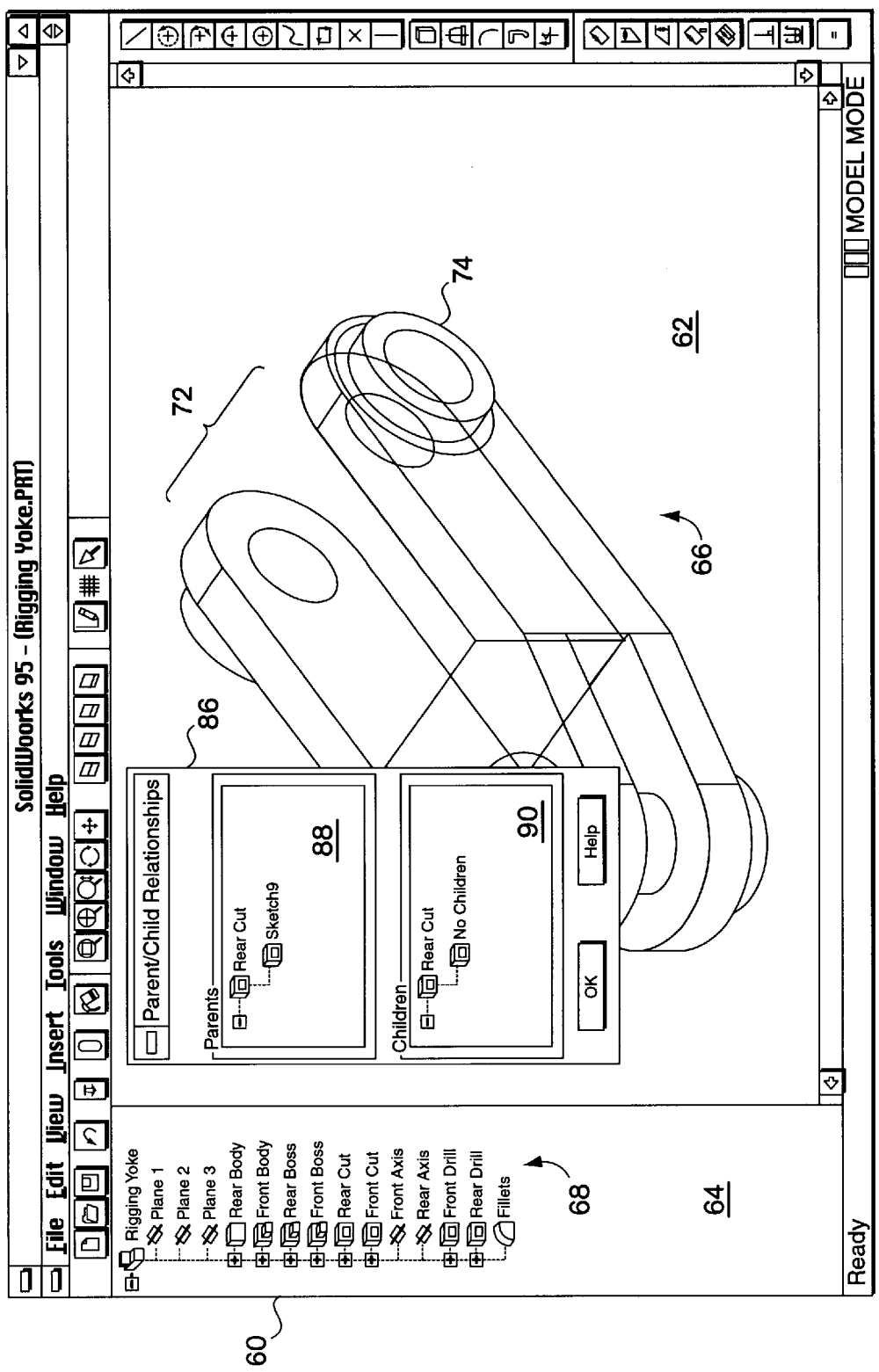
FIG. 9 is a window showing a model portion and a browser portion and illustrating a third option of the first pop-up menu.

Referring to FIG. 9, a window 86 is presented when the user selects the Parent/Child option from the pop-up menu 80 of FIG. 6. The Parent/Child option provides information about the parent and children relationships of the feature associated with the pop up window 80, in this case the Rear Cut feature. A parent-child relationship between features expresses dependency. Feature B is a child of feature A if B cannot exist without A. For example, consider a block feature A and a hole feature B drilled into the side of the block A. Hole B is a child of block A and block A is a parent of hole B. If block A is eliminated, hole B must also be eliminated.

The window 86 has a parent section 88 and a children section 90. The parent section 88 lists all of the features that are parent features of the Rear Cut feature. In the example shown in the window 86, the parent of the Rear Cut feature is the Sketch9 feature. Note that if the Sketch9 feature is eliminated, then the Rear Cut feature would also be eliminated since the rear cut is made by removing material from the model 66 corresponding to the Sketch9 feature projected a finite distance along a perpendicular axis thereof. The children portion 90 shows all of the children of the Rear Cut feature. In this particular instance, the Rear Cut feature has no children. Therefore, eliminating the Rear Cut feature will not necessitate elimination any other features of the drawing 66.

The ability to view the parent and child relationships of each of the features is very useful in that it allows the user to determine the effect of modifying or eliminating a particular feature. In the example of FIG. 9, the information in the parent/child window 86 indicates that the user can eliminate the Rear Cut feature without eliminating any other features of the drawing. The window 86 also indicates that eliminating the Sketch9 feature will necessitate elimination of the Rear Cut feature.

Figure 10:
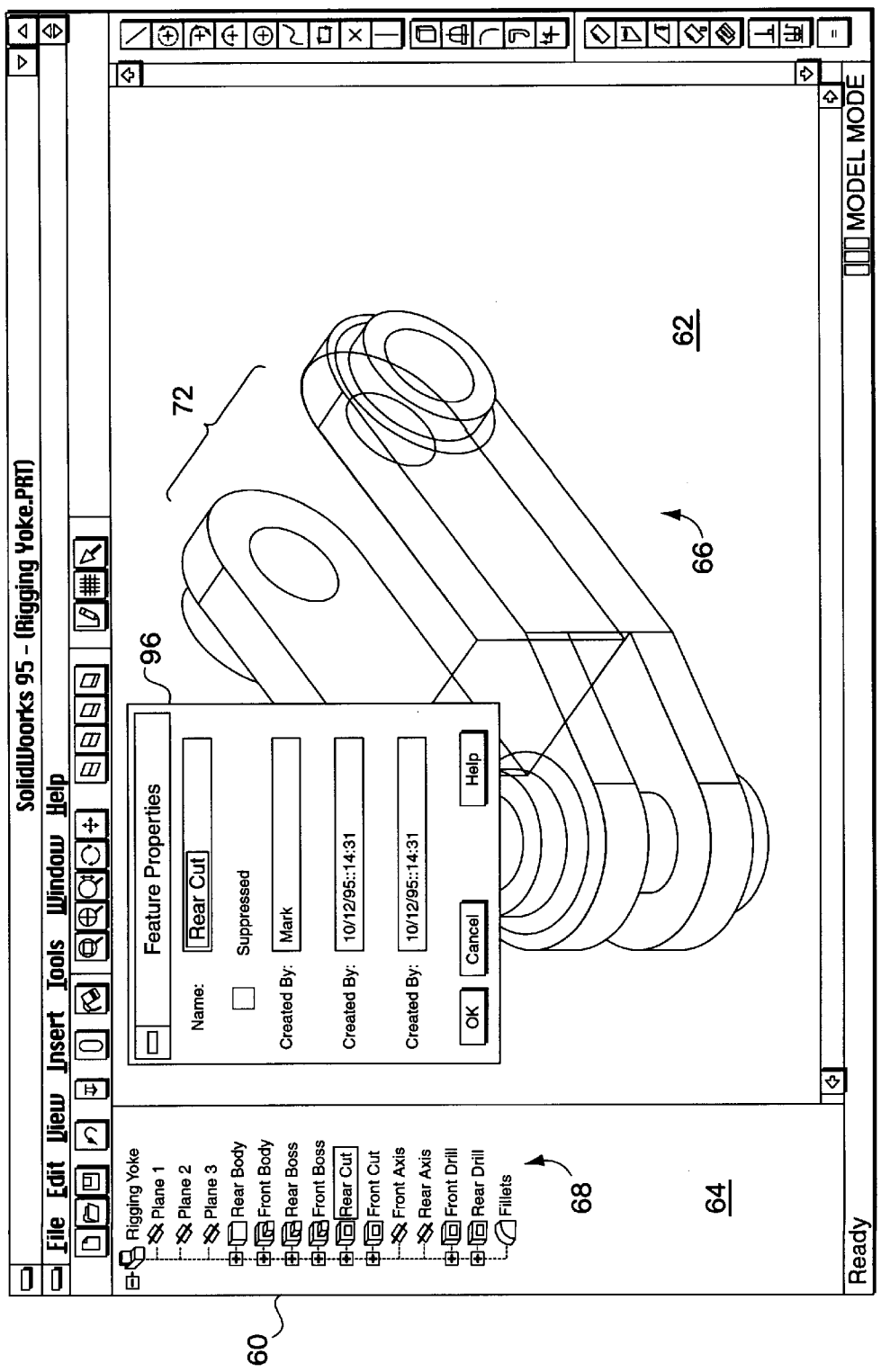
FIG. 10 is a window showing a model portion and a browser portion and illustrating a fourth option of the first pop-up menu.

Referring to FIG. 10, a window 96 is provided in response to the user selecting the Properties option of the pop-up menu 80 shown in FIG. 6. The properties shown in the window 96 are properties of the Rear Cut feature. Just as with the window 84 of FIG. 8, the user can modify items in the window 96 using the mouse 34 and/or the keyboard 33. Note that different types of features have different types of properties and so would probably provide a window different than the window 96 shown in FIG. 10. The specific properties that are shown for each type of feature are a design choice based on a variety of functional factors familiar to one of ordinary skill in the art.

Figure 11:
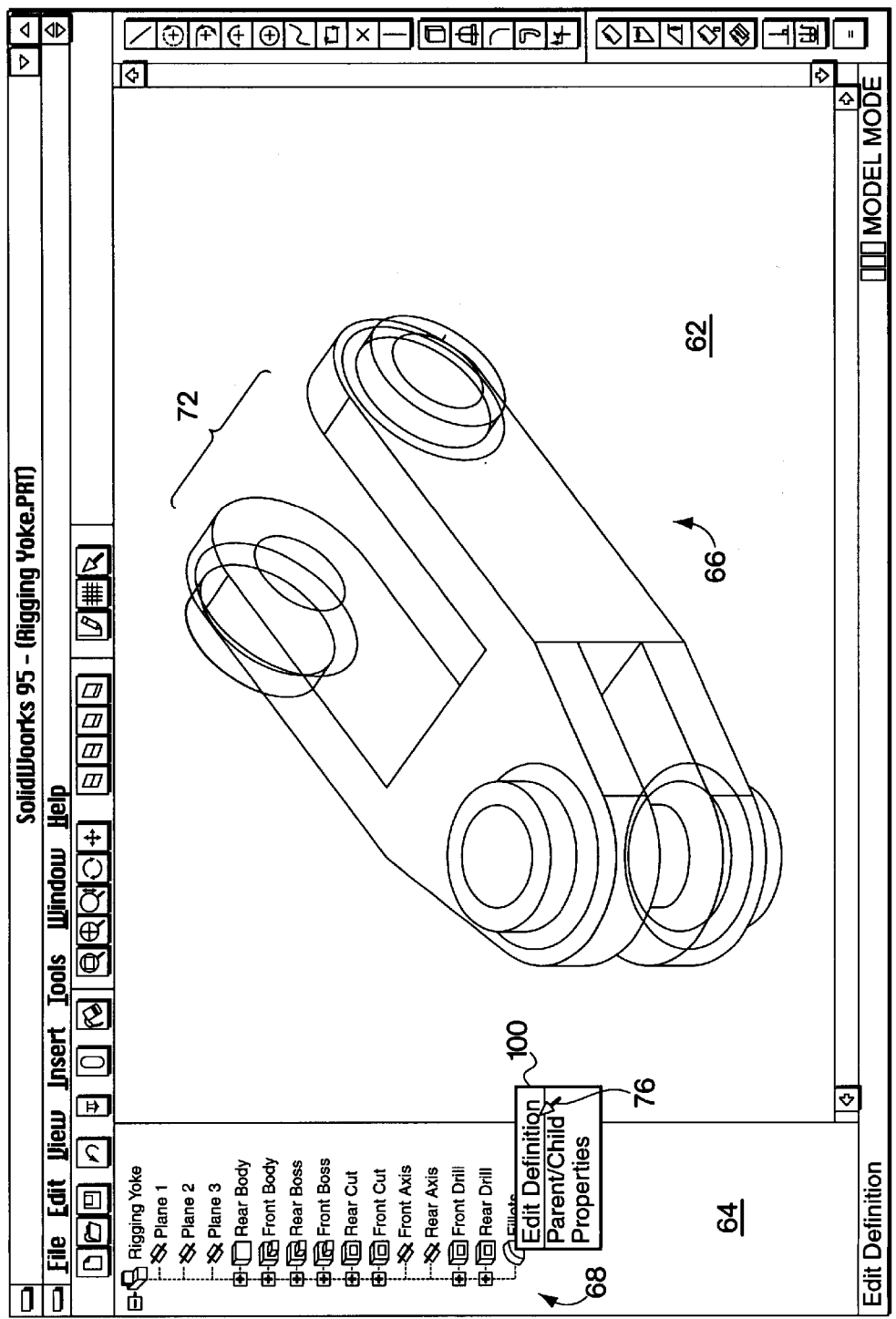
FIG. 11 is a window showing a model portion and a browser portion having a second pop-up menu superimposed thereon.

Referring to FIG. 11, a pop-up menu 100 is generated when the user places the cursor 76 over the Fillet feature and presses the right button of the mouse 34. A comparison of the pop-up menu 100 and the pop-up menu 80 of FIG. 6 illustrates that different pop-up menus can be used for different features. The pop-up menu 100 for the Fillet feature is different than the pop-up menu 80 for the Rear Cut feature. Each different type of feature can have a different pop-up menu associated therewith. The type, number of entries, and nature of entries of a pop-up menu is a design choice that depends on a variety of functional factors familiar to one of ordinary skill in the art.

Figure 12:
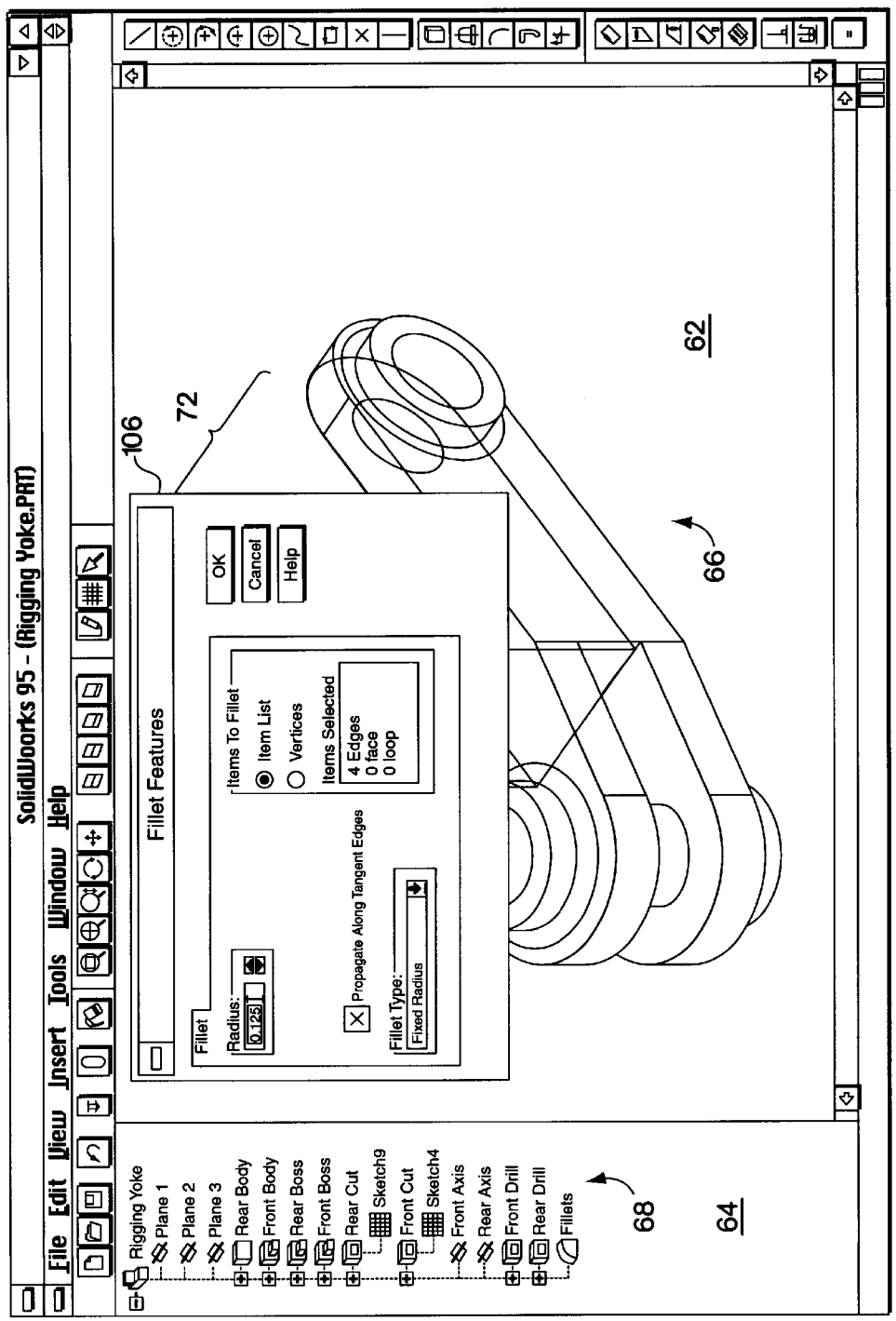
FIG. 12 is a window illustrating an option of the second pop-up menu.

Referring to FIG. 12, a window 106 is provided in response to the user selecting the Properties entry in the pop-up menu 100 of FIG. 11. Note that the window 106 is different than the window 96 of FIG. 10 which is provided when the user selects the Properties option from the pop-up menu 80 of FIG. 6 for the Rear Cut feature. This illustrates that even pop-up menu entries having the same name can differ for each feature in the feature list 68. The selection of which elements to provide in the feature list window 106 is a design choice that depends on a variety of functional factors familiar to one of ordinary skill in the art.

Figure 13:
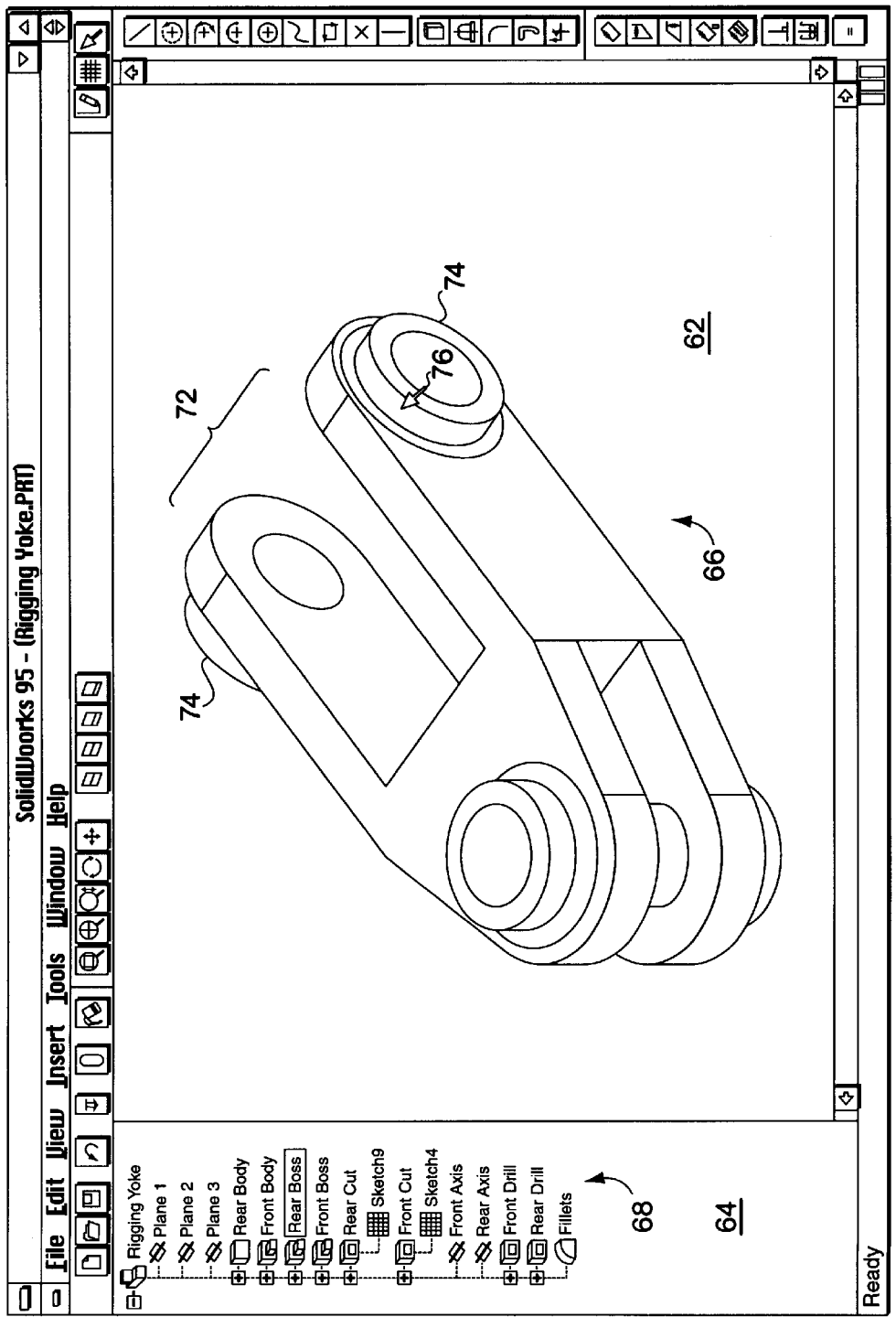
FIG. 13 is a window showing a model and illustrating a highlight option of the graphical browser.

Referring to FIG. 13, the drawing portion 62 is shown with the end of the cursor 76 coincident with the rear boss 74 portion of the model 66. Edges of the rear boss 74 are shown highlighted indicating that the user has single clicked the left button of the mouse 34 while the cursor 76 was in the position shown in FIG. 13. When this occurs, the Rear Boss feature from the feature list 68 is also highlighted by highlighting the associated text of the feature and changing the color of the icon. The icon color change is illustrated in FIG. 13 as a general darkening of the icon while text highlighting is shown by drawing the outline around the text of the feature. Text highlighting can also be provided by inverting the text in a conventional manner.

Highlighting allows the user to correlate faces or portions of the model 66 with specific features in the feature list 68. In addition, the user can move the cursor 76 over a particular feature in the feature list 68, click the left button of the mouse 34 one time, and cause both the selected feature in the feature list 68 and the associated edges in the model 66 to be highlighted. In this way, the user can correlate particular features from the feature list 68 with specific portions of the model 66.

Figure 14:
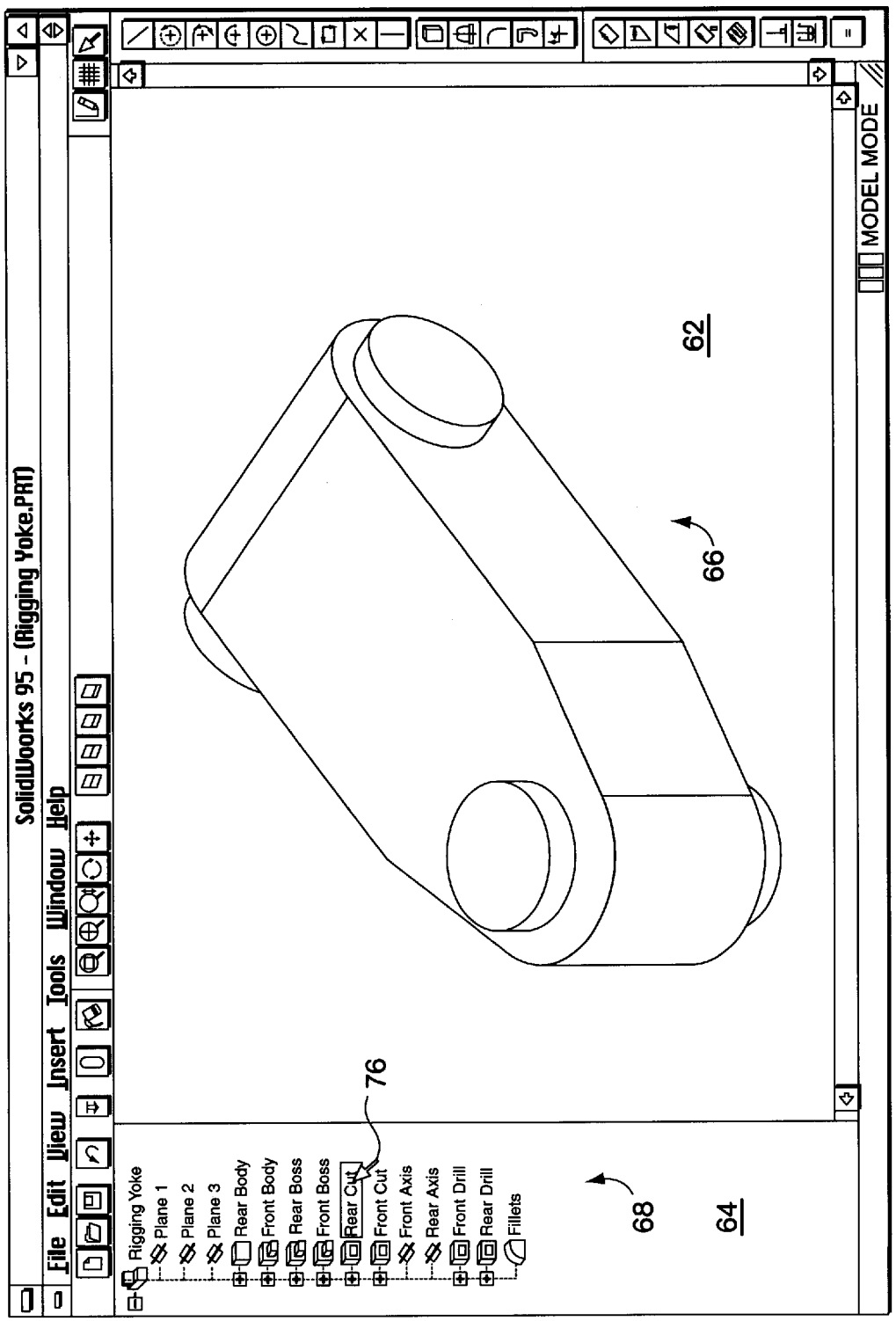
FIG. 14 is a window showing a model and illustrating a rollback option of the graphical browser.

Referring to FIG. 14, a rollback option is illustrated wherein features of the model 66 that follow a particular feature are not shown in the drawing portion 62. FIG. 14 shows the cursor 76 being placed on the Rear Cut feature of the feature list 68. The model 66 is shown with every feature from the Rear Cut downward (i.e, after the Rear Cut feature) eliminated. That is, the model 66 is shown without the Rear Cut, Front Cut, Front Drill, Rear Drill, and Fillets features from the feature list 68. A model can be rolled back to any feature shown in the feature list 68. Rolling back is useful for simplifying and debugging the model 66.

Figure 15:
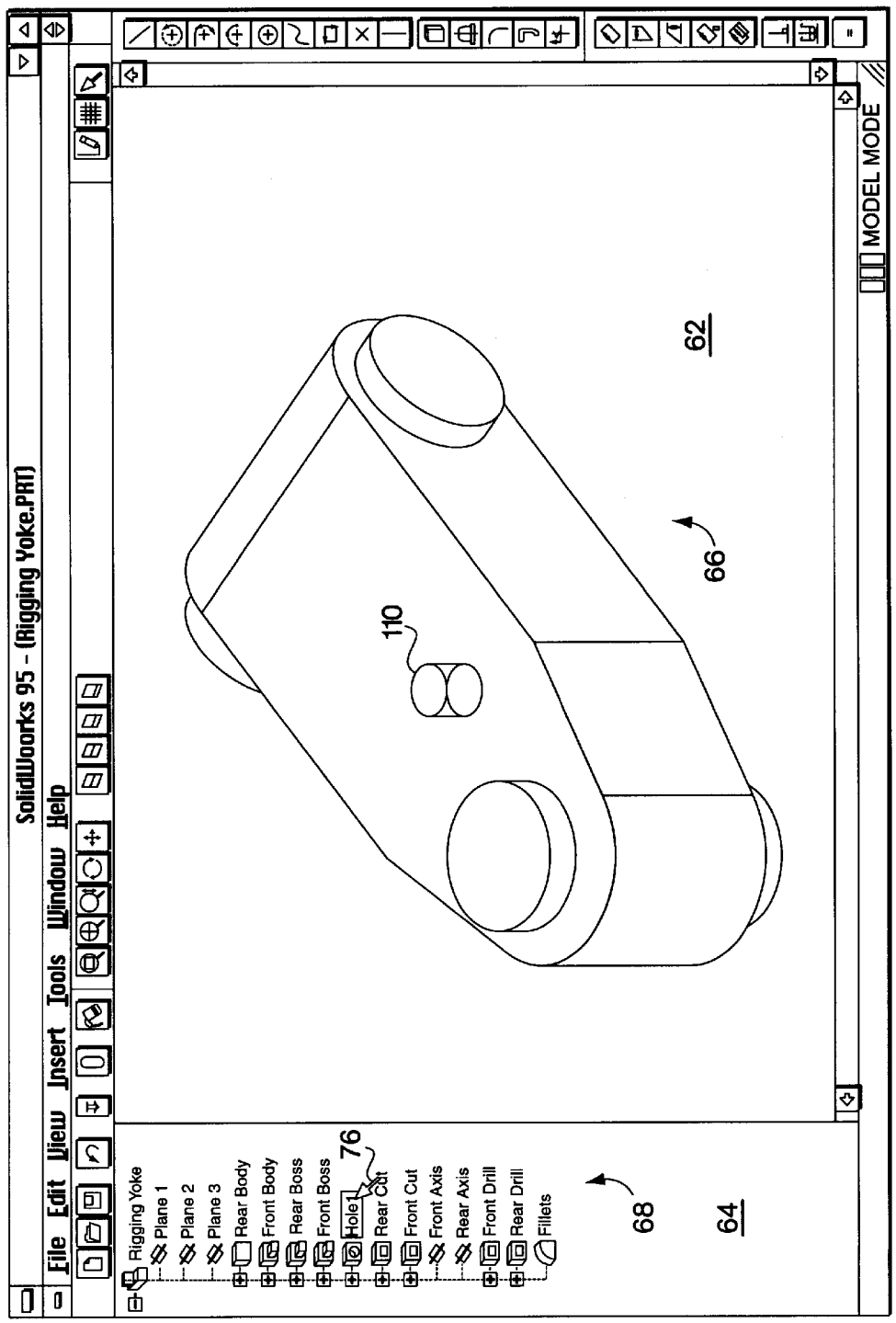
FIG. 15 is a window showing a model and illustrating an insert option of the graphical browser.

Referring to FIG. 15, an insertion option is illustrated wherein a new feature can be inserted at the rollback point shown in FIG. 14. In this case, the cursor 76 is pointing to a new feature labeled "Hole1". A hole 110 on the model 66 illustrates the Hotel feature of the feature list 68. Note that the remainder of the features from the feature list 68 remain suppressed in FIG. 15 in the same way as the features are suppressed in FIG. 14.

Figure 16:
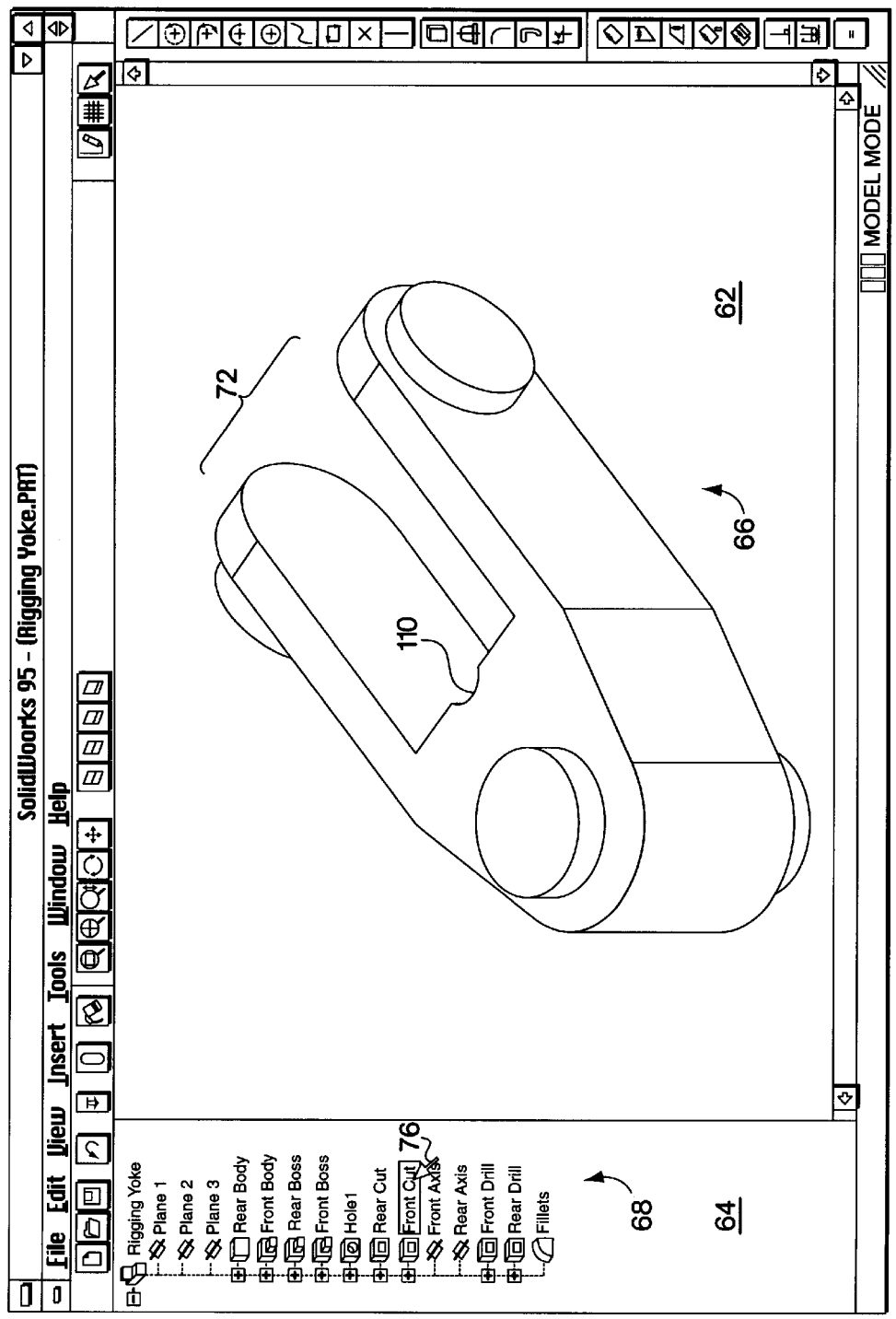
FIG. 16 is a window illustrating an option for stepping forward through features of the graphical browser.

Referring to FIG. 16, a stepping option is illustrated wherein the user can step one feature at a time through the rollback state in order to cause features to reappear, one at a time, in the model 66. As shown in FIG. 16, the cursor 76 has selected the Front Cut feature from the feature list 68. Accordingly, the model 66 is in a state that is rolled back to prior to insertion of the Front Cut so that the Front Cut, Front Drill, Rear Drill, and Fillets features are not shown on the model 66. Note that in this state, the rear cut 72 is shown in the model 66. Note also that the hole 110 is only partially shown since a portion of the hole 110 and a portion of the rear cut 72 overlap. In addition, unlike FIG. 15, the hole 110 is not shown in wire frame since the Hole1 feature is not selected from the feature list 68, as was the case in FIG. 15. Note that rolling back and stepping through the feature list 68 one feature at a time can be an efficient way to simplify and debug the model 66.

Figure 17:
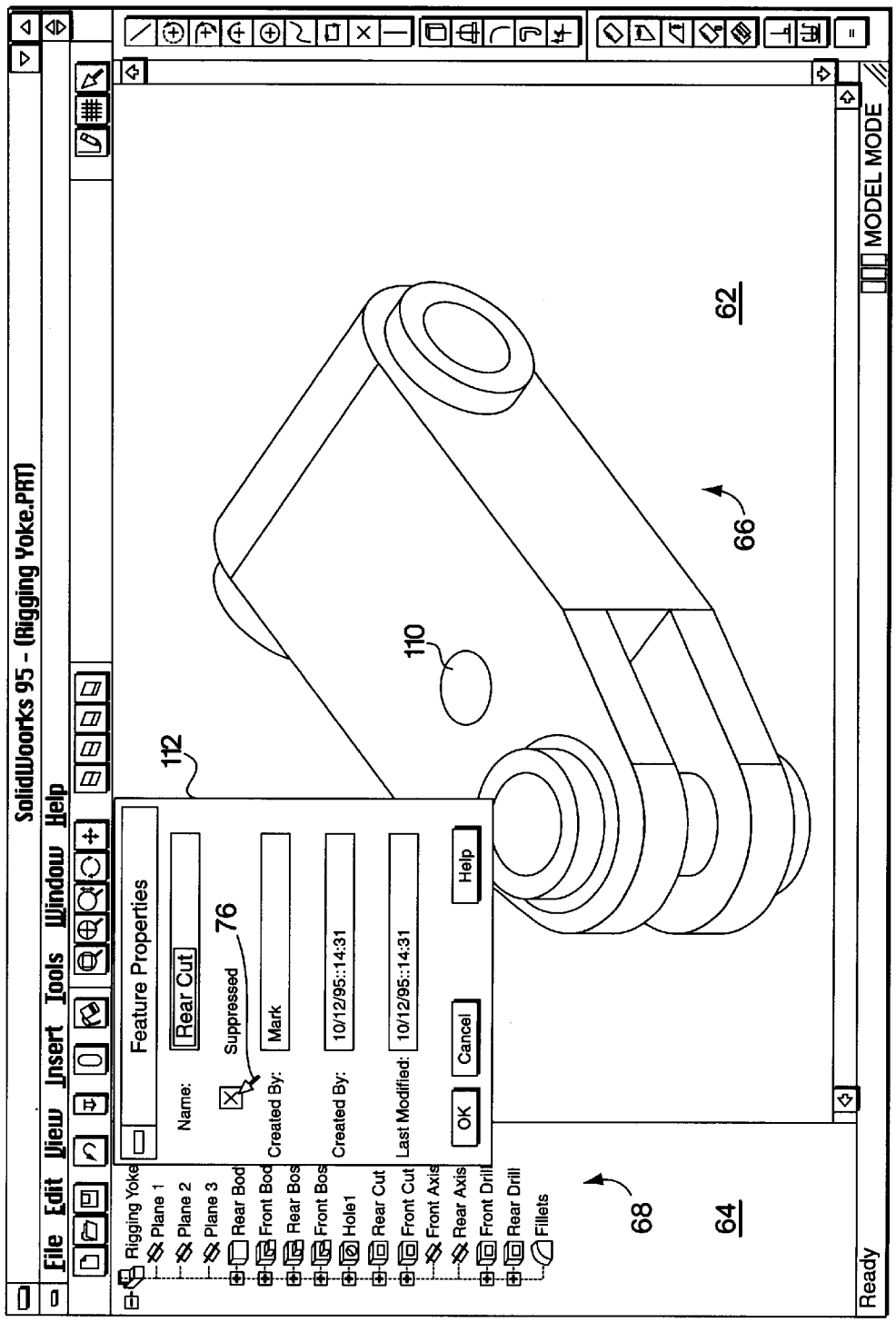
FIG. 17 is a window containing a model portion and a browser portion and illustrating an option for showing feature properties.

Referring to FIG. 17, an option for suppression of a single feature is illustrated. A dialog box 112 shows the cursor 76 being used to select suppression of the Rear Cut feature. The model 66 shows all of the features in the feature list 68 except the suppressed feature, the Rear Cut feature. Note that suppression of a single feature, as illustrated in FIG. 17 is different than rolling back the model 66 as shown in FIG. 14 because the model 66 shown in FIG. 17 contains all of the features in the feature list 68 except the suppressed feature (Rear Cut) while the model 66 shown in FIG. 14 contains only those features of the feature list 68 which precede the Rear Cut feature. That is, the model 66 of FIG. 14 does not show the Front Cut, Front Drill, Rear Drill, and Fillets features while the model 66 of FIG. 17 does show those features. The ability to suppress a single feature can be useful in simplifying and debugging a model.

Note that features similar to the roll back, suppression, insertion, and stepping option illustrated in FIGS. 14—17 are known in the art. However, implementing these options using the feature list 68 facilitates ease of use and visualization by the user who, with only the modeling portion 62 visible, would likely be reduced to guessing as to the ordering of features and the effect of, say, rolling back to a particular one of the features.

Figure 18:
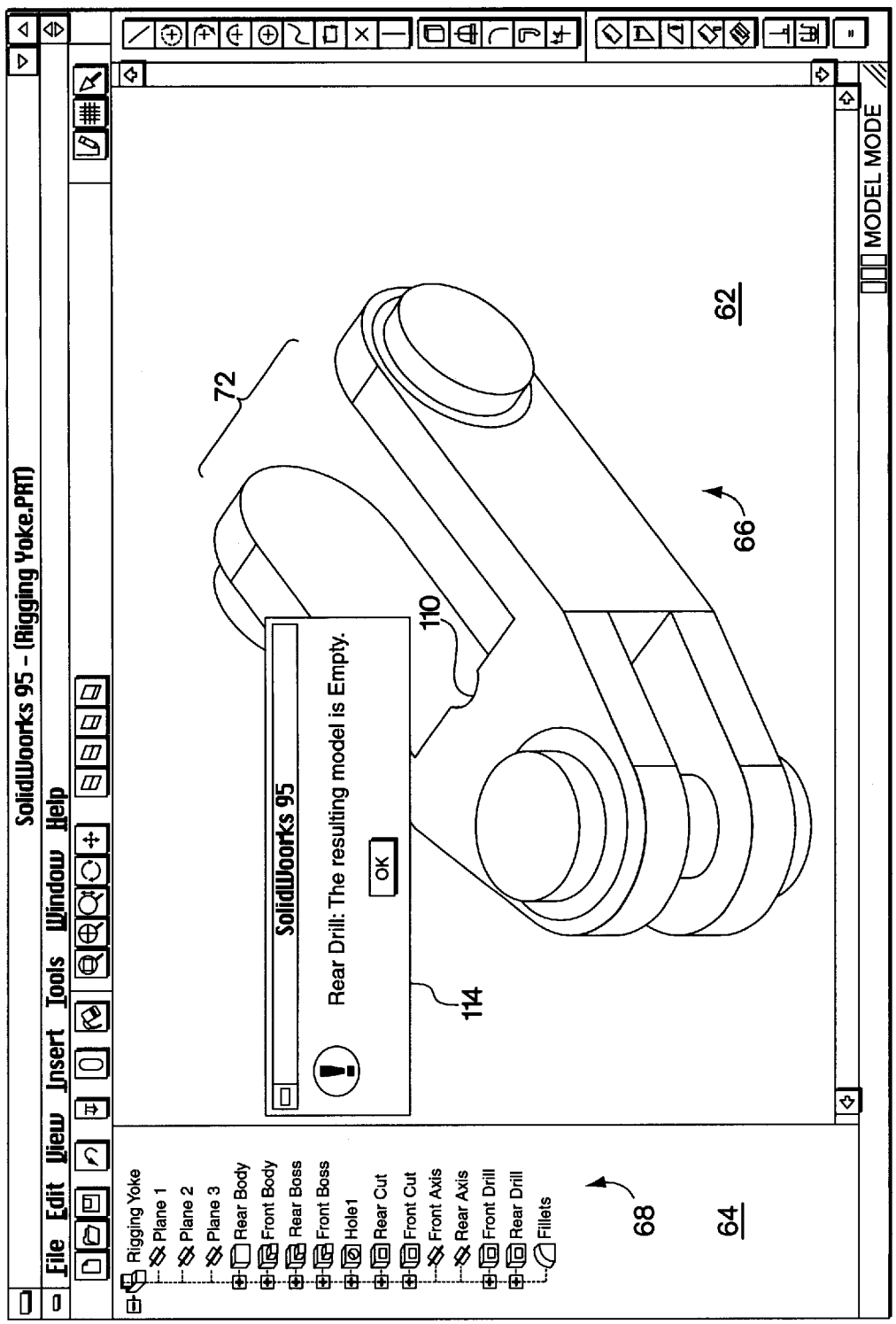
FIG. 18 is a window containing a model portion and a browser portion and illustrating an option for showing modeling errors.

Referring to FIG. 18, a dialog box 114 reports an error in the Rear Drill feature of the feature list 68. The error was artificially created by expanding the dimensions of the Rear Drill feature to beyond the size of the entire model 66. Note that in addition to reporting the error in the dialog box 114, the icon associated with the Rear Drill feature in the feature list 68 is highlighted, thus providing the user with a visual representation in the feature list 68 showing the source of the error in the model 66 that caused the dialog box 114 to be generated.

Figure 19:
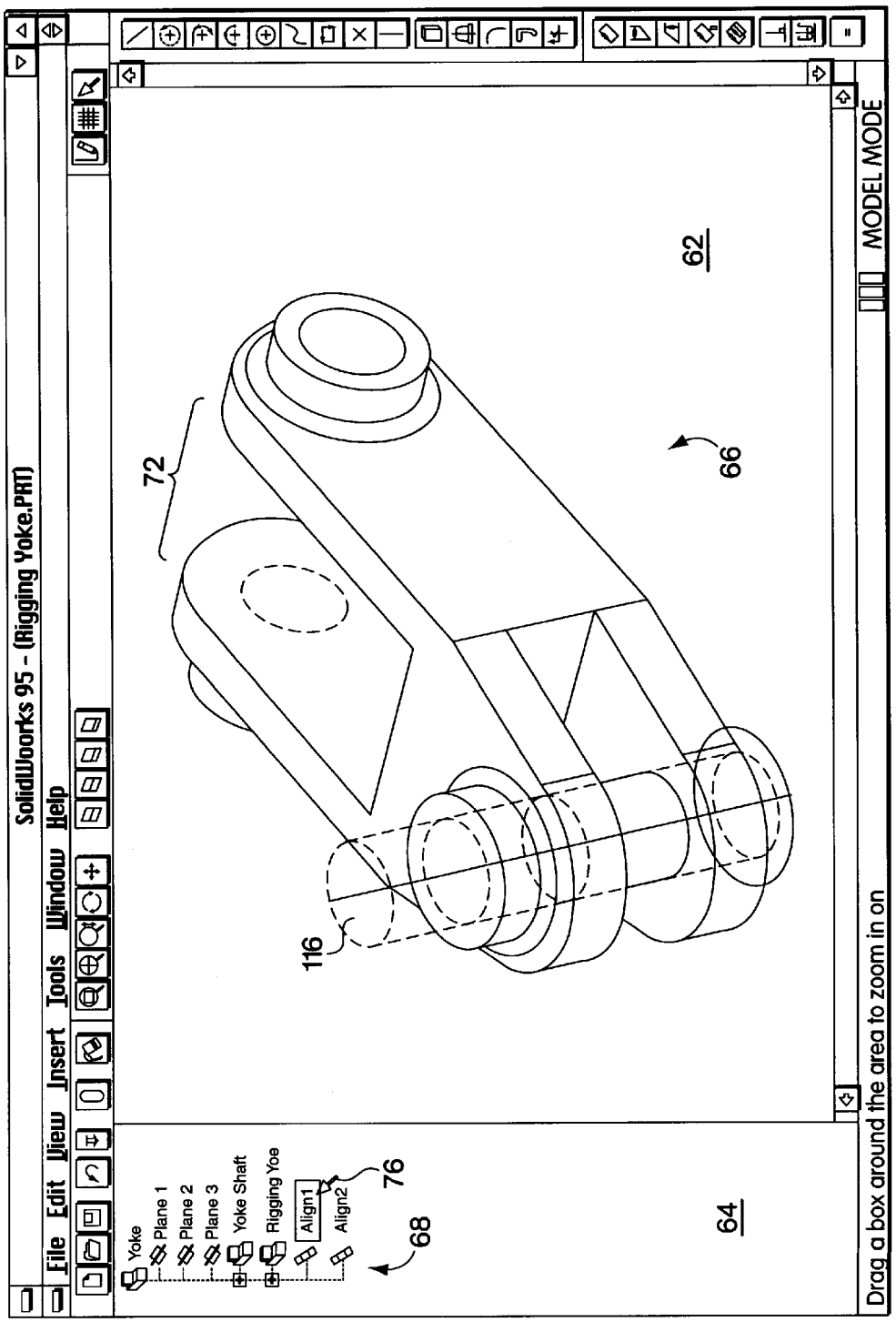
FIG. 19 is a window containing a model portion and a browser portion and illustrating an option for showing alignment features of the model.

Referring to FIG. 19, the model 66 is illustrated with a shaft 116 inserted in a front hole of the model 66. In order for the shaft 116 to remain properly inserted into the front hole, it is essential that the relative alignment of the shaft 116 and the remainder of the model 66 remain constant irrespective of any changes in orientation of the model 66. That is, moving the shaft 116 should also cause the remainder of the model 66 to move the same amount. Otherwise, the shaft 116 will not maintain alignment in the front hole of the model 66 as shown in FIG. 19. Accordingly, when the shaft 116 is created, the user can specify specific alignment between the shaft 116 and the model 66. In FIG. 19, the alignment of the shaft 116 is constrained two separate ways: the bottom face of the shaft 116 is aligned with the bottom face of the boss located in the front of the model 66 and the outside face of the shaft 116 is aligned with the inside face of the hole through which the shaft 116 is placed. These two separate alignments are shown in the feature list 68 as "Align1" and "Align2" features. Note that the general technique of aligning models are known to one of ordinary skill in the art.

The user may be interested in seeing which faces of the shaft 116 and the model 66 are aligned. The user can do this by placing the cursor 76 over one of the aligned features in the feature list 68 and clicking on the left button of the mouse 34. Clicking on the left button causes the feature in the feature list 68 to be highlighted and causes the faces which are aligned to also be highlighted in the model portion 62. For example, as shown in FIG. 19, the user has clicked the left button of the mouse 34 on the Align1 feature in the feature list 68 and caused the outside circumferential face of the shaft 116 to be highlighted and has caused the inside face of the hole through which the shaft 116 passes to also be highlighted. The ability to highlight faces that are aligned is useful in keeping track of various alignment constraints of a model being constructed by the user.

Referring to FIG. 20A, a window 130 shows the list of features from the feature list 68 along with three columns 132–134 which show an amount of memory required to store each of the features, date of last modification of each of the features and a time of modification of each of the features, respectively. The window 130 represents a different way to present information about features in the feature list 68.

Referring to FIG. 20B, a window 140 also shows features from the feature list 68. In addition, the window 140 has three columns 142–144 similar to the columns 132–134 of FIG. 20A. Note that the ordering of the features in the window 140 is by the amount of memory used to store each feature shown in the column 142. The feature which requires the least amount of memory storage is shown at the top of the list followed by the feature requiring the next most amount of memory storage and so forth until the feature at the bottom of the list requires the greatest amount of memory storage. FIGS. 20A and 20B illustrate that the features of the feature list 68 can be sorted and presented in any convenient manner that facilitates use and access by the user. It would have also been possible to show the features of the feature list 68 being sorted by any other criteria including, for example, being sorted in alphabetical order by feature name.

Figure 21:
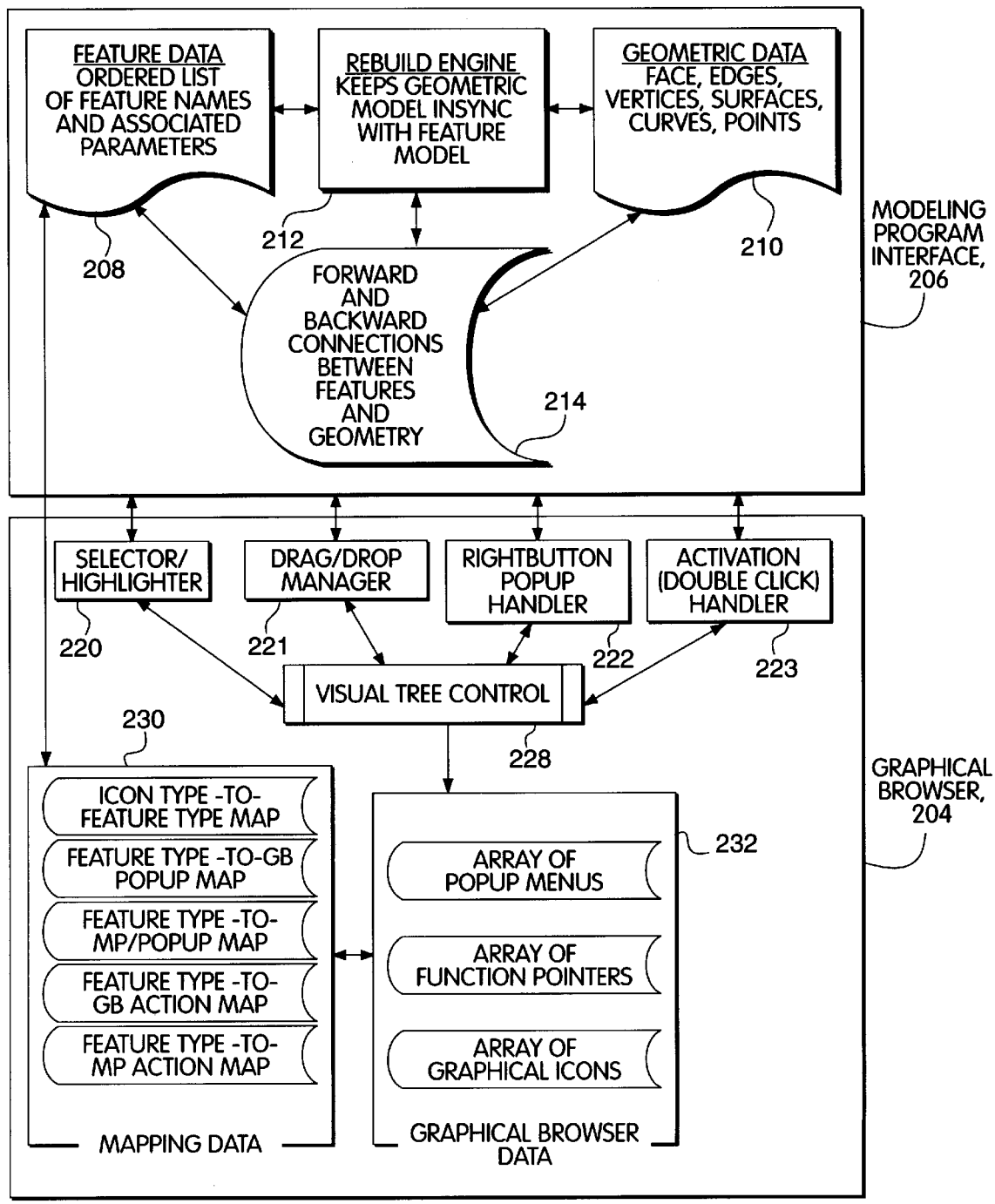
FIG. 21 is a data flow diagram illustrating interfacing and data exchange between a conventional modeling program and the graphical browser.

Referring to FIG. 21, a data flow diagram 200 illustrates interfacing between graphical browser software 204 and a modeling program 206. The graphical browser 204 can be implemented in conjunction with almost any computer modeling program in a manner described in detail below. The graphical browser 204 conducts operations on the data of a modeling program to provide the functionality illustrated above. Accordingly, the graphical browser 204 operates essentially independently of the executable code of the modeling program. Interfacing a conventional, generic, computer modeling program with the graphical browser consists essentially of interfacing the modeling program with the graphical browser to provide the graphical browser 204 with access to the modeling data of the modeling program. Details of this interface, including preferred data formats, are described in detail below.

The modeling program interface 206 includes data used by the graphical browser 204 to perform the operations illustrated in FIGS. 1–20 and discussed above. The interface data includes feature data 208 and geometric data 210. The feature data 208 contains a list of the features (e.g., planes, extrusions, lines, et cetera) of the model. The feature data 208 is implemented using conventional computer data storage means and is constructed/modified as the user creates and modifies the object being drawn.

The geometric data 210 represents computer data (stored by conventional means) indicative of the faces, edges, vertices, surfaces, curves, points, and other low level geometric characteristics of the model. The modeling program can use the geometric data 210 to display the model on the screen.

A rebuild engine 212 converts the feature data 208 to the geometric data 210. The rebuild engine 212 is executable code that converts each element of the feature data 208 into corresponding edges, faces, vertices, et cetera of the geometric data 210. The rebuild engine 212 also provides connections data 214 indicating forward and backward connections between features and geometry. That is, the connections data 214 contains entries for each feature in the feature data 208 indicating the particular faces, edges, vertices, et cetera that correspond to each of the low level features of the geometry data 210. In addition, the connections data 214 also contains information that relates each entry in the geometric data 210 with one or more features in the feature data 208. Using the connections data 214, it is possible to correlate each feature in the feature data 208 with the resulting geometric data 210 and it is possible to correlate each entry of the geometric data 210 with features in the feature data 208.

The feature data 208, geometric data 210, rebuild engine 212, and connections data 214 can be implemented in conjunction with the modeling program in a variety of conventional manners in order to provide the modeling program interface 206. One example of this type of modeling data storage/presentation/conversion is found in a publication titled "Geometric Modeling" by Michael E. Mortenson, copyright 1985 and published by John Wiley & Sons, Inc. of New York, N.Y., ISBN 0-471-88279-8. It is also possible to implement the modeling program interface 206 in a variety of other conventional manners, provided that the feature data 208, geometric data 210, and connections data 214 are available for use by the graphical browser 204 to provide the functionality described below in connection with the detailed discussion of the graphical browser 204.

Note that various ones of the options, such as feature suppression, rolling back, and feature insertion, can be implemented in conjunction with a modeling in a variety of conventional manners. For example, feature suppression and rolling back can be implemented by having a data field for each feature indicating whether the feature is suppressed. If the graphical browser 204 writes to the field to indicate that a particular feature is suppressed, then the rebuild engine 212 treats that feature as if the feature does not exist, thus suppressing generation of corresponding geometry data 210 and modifying the display of the model accordingly.

The graphical browser 204 includes a selector/highlighter code module 220, a drag/drop manager code module 221, a right button pop-up handler code module 222, and an activation handler code module 223. The code modules 220–223 interact with the modeling program interface 206 by receiving and sending data thereto. Operation of the code modules 220–223 is described in more detail below.

The code modules 220–223 interact with a visual tree control code module 228. The visual tree control module 228 is a commercially available software package, is provided by Microsoft Corporation of Redmond, Wash., that handles the graphical browser user interface in a manner described in more detail below. Specific aspects of the user interface illustrated in FIGS. 1–20 and not discussed below are provided by the visual tree control module 228.

The graphical browser 204 also includes mapping data 230 that correlates various feature types and characteristics thereof. The mapping data 230 includes an icon type to feature type map which correlates specific types of features (e.g., planes, fillets, et cetera) with specific icons therefore that are shown on the graphical browser screen. Examples of different types of icons for different features are shown throughout the examples given in FIGS. 1–20. The mapping data 230 also includes a feature type to graphical browser pop-up menu map. This map correlates the specific pop-up menus that are provided in connection with different types of features. As discussed above in connection with FIGS. 1–20, each feature can have a different pop-up menu associated therewith.

The mapping data 230 also contains a feature type to modeling portion pop-up menu map. This map is similar to the feature type to graphical browser pop-up map except that it correlates feature types with pop-up menus that appear in the modeling portion rather than feature types with the pop-up menus that appear in the feature window. For each type of feature, it is possible to have a different pop-up menu appear in the graphical browser portion versus the modeling portion. The mapping data 230 also contains two additional maps: feature type to graphical browser action map and a feature type to modeling portion action map. These maps contain pointers to executable code that is run in connection with double clicking the left button of the mouse when the mouse cursor is on either a portion of the model in the modeling window or on an icon in the graphical browser. Note that just as it is possible for a particular feature to have different pop-up menus that appear in either the graphical browser portion or the modeling portion, then too it is possible for a feature to have different actions associated therewith depending upon whether the feature is selected in the graphical browser portion or the modeling portion.

Some of the entries in the mapping data 230 are provided by graphical browser data 232 which contains arrays of pop-up menus, function pointers, and graphical icons. Other entries in the mapping data 230 are provided by the feature data 208 through the modeling program interface 206. Accordingly, each entry in each map of the mapping data 230 contains one element from the feature data 208 and one element from the graphical browser data 232. Note that the arrays of pop-up menus, the arrays of function pointers, and the arrays of graphical icons found in the graphical browser data 232 can be stored and accessed in a conventional manner to the graphical browser 204.

Figure 22:
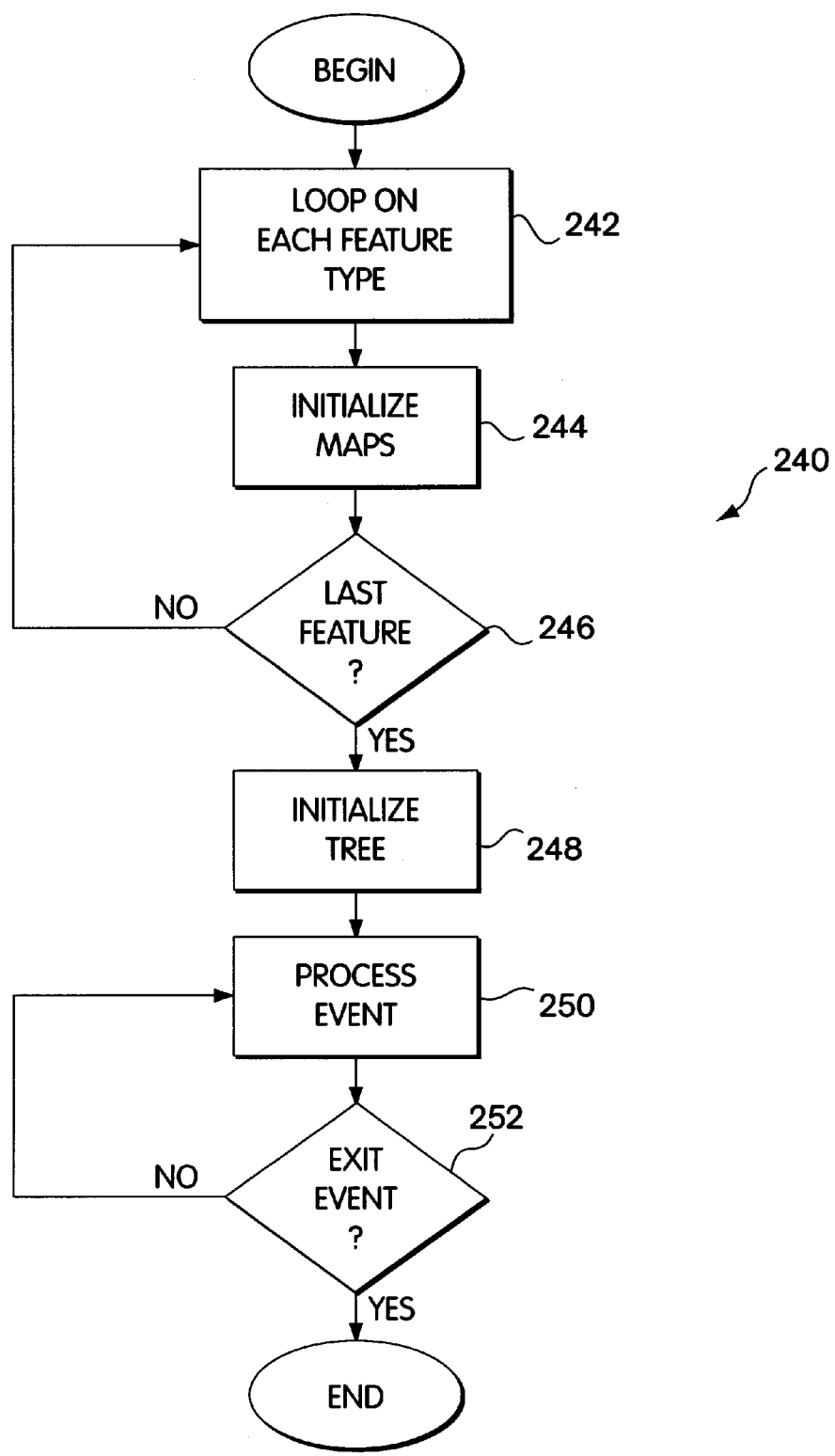
FIG. 22 is a flow chart showing overall operation of the graphical browser.

Referring to FIG. 22, a flow chart 240 illustrates overall operation of the graphical browser 204. At a first step 242, a loop variable is initialized to loop on each of the different types of features used by the graphical browser 204. Following the step 242 is a step 244 where the maps of the mapping data 230 are initialized for each of the features represented by the loop variable representing each of the features. For example, for the fillets feature, the initialize maps step 244 would initialize the mapping data 230 to provide the icon used for the fillets feature in the icon to feature map, would provide the pop-up menu used for the fillets feature in the feature type to graphical browser pop-up map, et cetera.

Following the step 244 is a test step 246 which determines if the last feature has been accessed to initialize the mapping data 230. If not, then control transfers from the step 246 back to the step 242 to access another feature to initialize the mapping data 230. If, on the other hand, it is determined at the step 246 that the looping variable is equal to the last and final feature from the feature data 208, then the entirety of the mapping data 230 has been initialized and control transfers from the step 246 to a step 248 where the visual tree control module 228 and tree data is initialized. The specific method of initializing the visual tree control module 228 is explained in instruction manuals which are provided by Microsoft Corporation with the visual tree control module software. Initializing the actual tree shown on the screen involves accessing the feature data 208 to determine order of creation, dependencies, etc. for each of the features, and then making appropriate calls to the visual tree control module 228, passing on feature names, icons (from the mapping data 230), connections, etc.

Following the step 248 is a step 250 where a window event initiated by the user is processed. Essentially, the remainder of operation of the graphical browser 204 consists of processing user events at the step 250. A detailed discussion of the step 250 is provided below. Following the step 250 is a test step 252 which determines if the event provided by the user is an exit event, i.e., if the user has indicated a desire to exit the graphical browser program 204 (and, by inference, exit the modeling program). If not, then control transfers from the test step 252 back to the step 250 to process the next event entered by the user. Otherwise, if it is determined at the test step 252 that the user has exited the program, then processing for the graphical browser 204 is complete.

Figure 23:
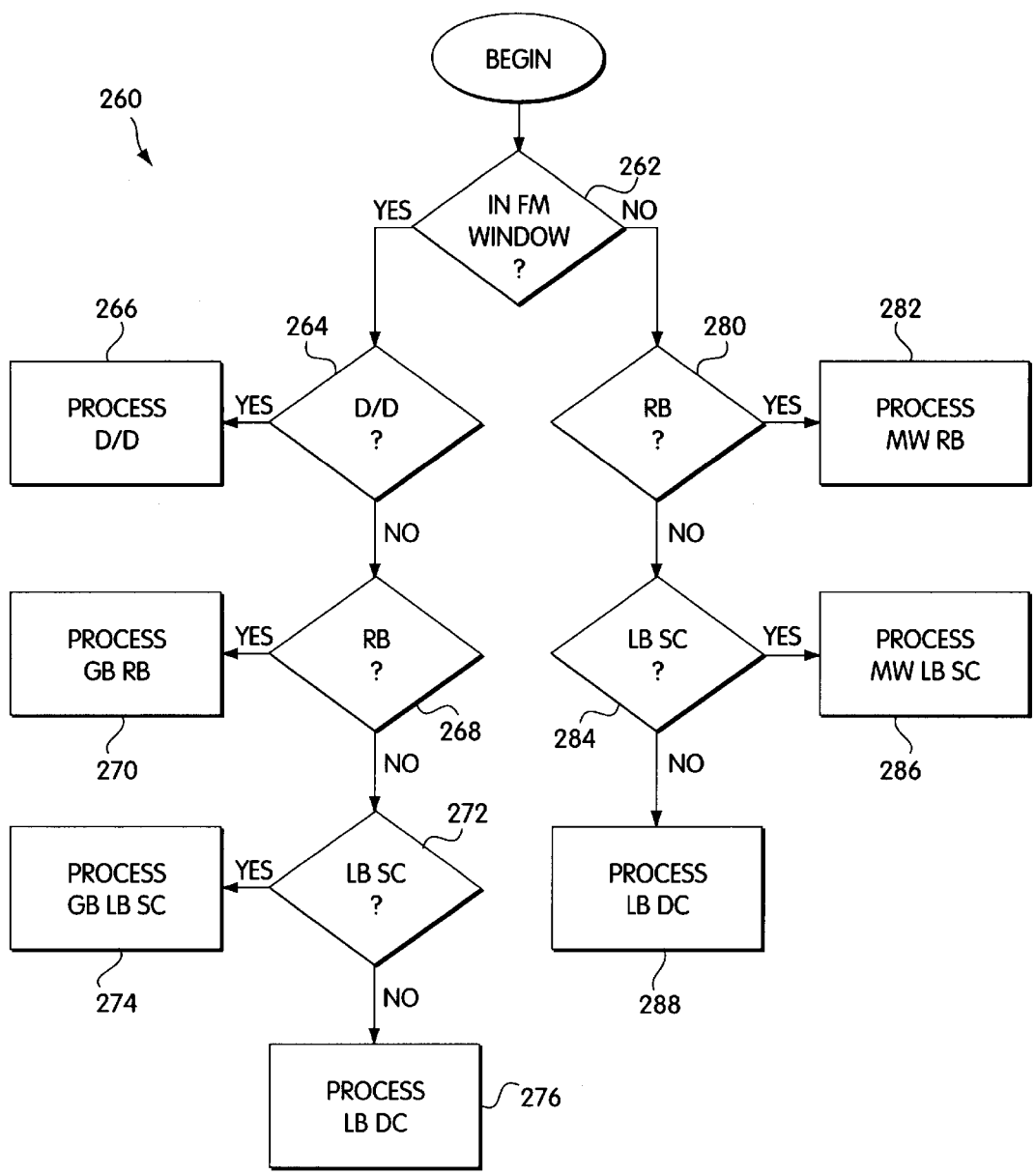
FIG. 23 is a flow chart showing event handling for the graphical browser.

Referring to FIG. 23, a flow chart 260 illustrates the process events step 250 shown in the flow chart 240 of FIG. 22. An event is user initiated and occurs when the user takes an action to interact with the modeling program. Events are initially handled by the operating system (Microsoft Windows) which passes on the events to the modeling program. Appropriate events that are passed on to the graphical browser 204 include mouse clicking events that cause the graphical browser to take specific action.

For the flow chart 260, processing begins at the test step 262 to determine if the mouse clicking event occurred while the mouse cursor was in the graphical browser portion of the window or the modeling portion of the window. If the mouse was clicked while the cursor was in the graphical browser portion, then control transfers from the test step 262 to a test step 264 to determine if the mouse clicking event is in conjunction with a drag and drop (D/D) operation. Note that the determination if the mouse click is in the graphical browser window or the modeling portion of the window, and the determination if the mouse click is performed in conjunction with a drag and drop operation are both performed by the operating system and/or the tree control module 228. The graphical browser 204 simply receives data indicative of this information. Note also that, as discussed above, the cut and paste operation is similar to the drag and drop operation. Accordingly, the discussion of dragging and dropping which follows can also apply to cutting and pasting.

If it is determined at the test step 264 that the data being provided is a mouse click performed in conjunction with a drag and drop operation, then control transfers from the test step 264 to a step 266 where the drag and drop operation is processed. Processing the drag and drop operation at the step 266 is described in more detail hereinafter.

If it is determined at the step 264 that the mouse click is not being provided in connection with a drag and drop operation, then control transfers from the test step 264 to a test step 268 to determine if the right button of the mouse is being clicked. If so, then control transfers from the test step 268 to a step 270 which processes the right button click of the mouse while the cursor of the mouse is in the graphical browser portion of the window. The processing step 270 is described in more detail hereinafter.

If it is determined at the test step 268 that the right button of the mouse has not been clicked, then control transfers from the test step 268 to a test step 272 to determine if the left button of the mouse has been single clicked. Note that, as discussed above in connection with FIGS. 1–20, single clicking the left button of the mouse performs a different operation than double clicking the left button of the mouse. If it is determined at the test step 272 that the left button of the mouse has been single clicked, then control transfers from the test step 272 to the step 274 to process the left button single click of the mouse. The processing at the step 274 is described in more detail hereinafter.

If it is determined at the test step 272 that the left button of the mouse has not been single clicked, then control transfers from the test step 272 to a step 276 which processes the double click of the left button of the mouse in the graphical browser. Accordingly, the step 276 is reached when the user double clicks the left button of the mouse while the cursor of the mouse is in the graphical browser.

Note that the flow chart 260 does not take into account events which occur that are not processed by the graphical browser 204. However, one of ordinary skill in the art can appreciate that irrelevant events are simply not processed by the graphical browser 204. Processing the double click of the left button of the mouse while the cursor of the mouse is in the graphical browser is performed at the step 276, which is described in more detail hereinafter.

If it is determined at the step 262 that the mouse button has not been clicked while the cursor of the mouse is in the graphical browser portion of the window, then presumably the mouse has been clicked while the cursor was in the modeling portion of the window control transfers from the step 262 to a test step 280 to determine if the right button of the mouse has been clicked. If so, then control transfers from the test step 280 to a step 282 to process the clicking of the right button of the mouse while the cursor of the mouse is in the modeling portion of the window. The step 282 is described in more detail hereinafter.

If it is determined at the step 280 that the user has not pressed the right button of the mouse, then control transfers from the step 280 to a test step 284 to determine if the user has single clicked the left button of the mouse. If so, then control transfers from the step 284 to a step 286 to process the left button single click of the mouse. Processing the left button single click of the mouse at the step 286 is described in more detail hereinafter.

If it is determined at the step 284 that the user has not single clicked the left button of the mouse, then control transfers from the step 284 to a step 288 to process the double click of the left button of the mouse while the cursor of the mouse is in the modeling portion of the window. Processing at the step 288 is identical to processing at the step 276 and is described in more detail hereinafter.

Figure 24:
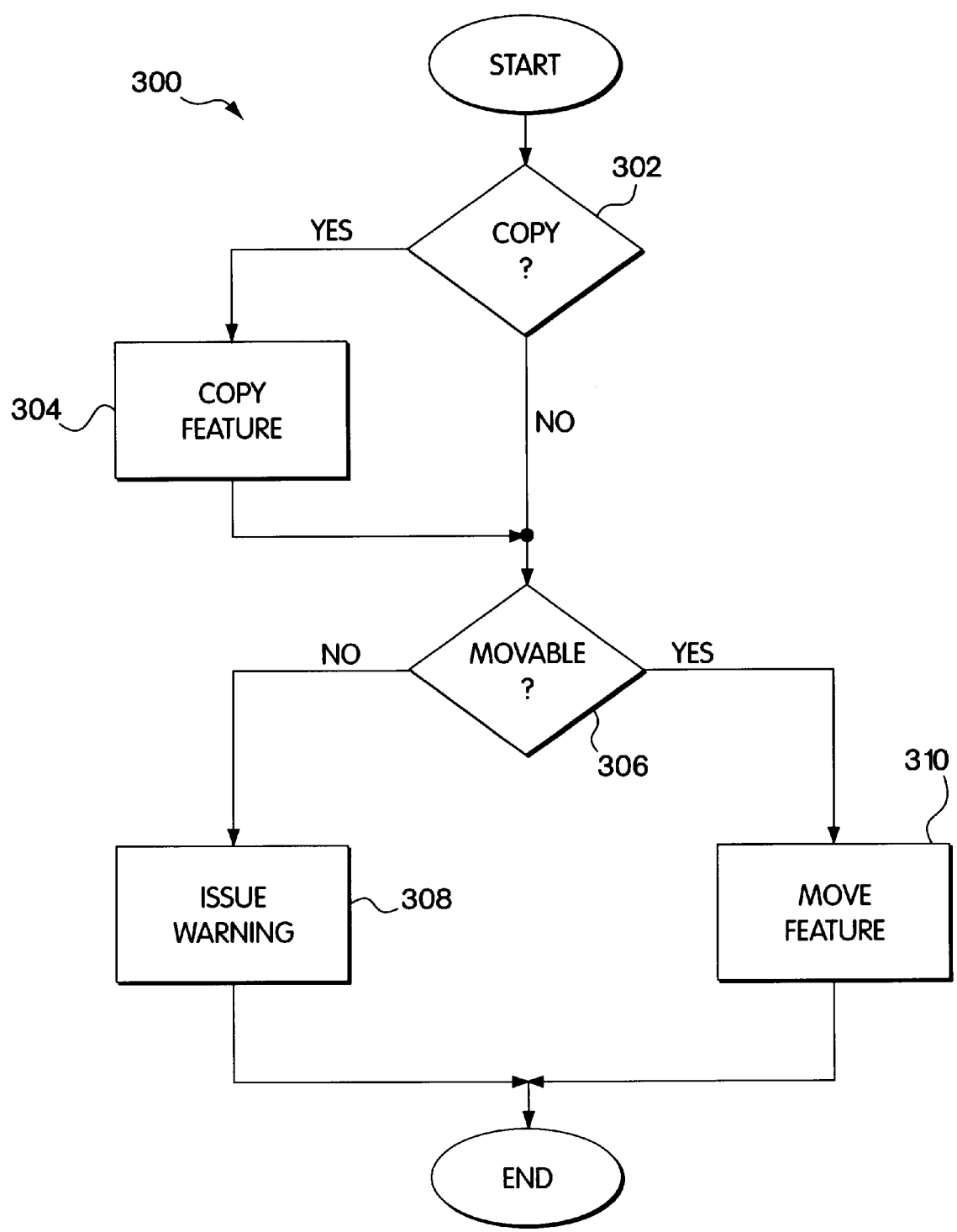
FIG. 24 is a flow chart showing the drag and drop operation of the graphical browser.

Referring to FIG. 24, a flow chart 300 illustrates in detail operation of the drag and drop step 266 of FIG. 23. At a first test step 302, it is determined if the user is copying the feature being dragged and dropped or if the user is moving the feature. When a feature is copied in the drag and drop procedure, the feature remains in its original location in the feature list while a copy of the feature is moved to a new location indicated by the user. If a feature is not copied during the drag and drop operation, then the selected feature is detached from the original location in the feature list and placed in a new location indicated by the user. Note also that the tree control module 228 shown in FIG. 21 handles most of the operations for the drag and drop including moving the icons, copying the icons, providing data indicative of the icons being dragged and dropped to the graphical browser 204, and handling most of the details of dialog boxes, et cetera. Essentially, most of the drag and drop operation is performed by the virtual tree control module 228.

If it is determined at the test step 302 that the user is copying the feature that is being dragged and dropped, then control transfers from the step 302 to a step 304 where the feature is copied. The user interface portion of copying the feature is performed by the virtual tree control module 228 code section that handles the drag and drop. The graphical browser software 204 simply receives an indication from the virtual tree control module 228 that the feature selected by the user is in fact being copied rather than moved from its original location. The graphical browser 204 copies the feature in the feature data 208.

A test step 306 follows either the step 304 or the step 302. At the test step 306, it is determined if the feature selected by the user is movable. Whether a feature is movable is a function of the modeling program used in conjunction with the graphical browser 204, but often entails a determination if a selected feature is being moved ahead of features on which the selected feature depends. For example, if an extrusion is constructed using a sketch, then the sketch cannot be moved ahead of the extrusion since then the extrusion would then become undefined. The extrusion feature depends on the sketch feature and hence the sketch feature must come before the extrusion feature. Note that this is not the case if the sketch feature is copied rather than simply moved.

The movability determination at the step 306 can be made in a variety of manners, including making a call in to the modeling program which returns a Boolean variable indicating that a particular feature is movable to a particular location or not. It is also possible for the modeling program to maintain information in the feature data 208 indicating which ones of the features can be moved ahead of which other ones of the features. Alternatively, for a relatively unsophisticated modeling program, it is possible to simply return "true" or "yes" each time the test is made at the step 306, thus rendering permissible all drag and drop operations performed by the user. Of course, in this instance, performing a drag and drop that leaves features undefined could have undesirable effects on the model. However, handling the test at the step 306 this way is one of many design choices available.

If it is determined at the test step 306 that the feature being dragged and dropped is not movable, then control transfers from the step 306 to a step 308 where the user is issued a warning in the form of a dialog box indicating that the desired drag and drop operation is impermissible. Following the step 308, processing for the drag and drop operation is complete.

If it is determined at the step 306 that the feature is movable, control transfers from the step 306 to a step 310 where the feature is moved. Moving the feature involves sending a signal to the virtual tree control module 228 indicating that the operation provided by the user is acceptable and so the feature list on the graphical browser should be modified. In addition, the graphical browser 204 modifies information in the feature data 208 in order to indicate the changed ordering of the features. At this stage, it may be necessary for the modeling program interface 206 to activate the rebuild engine 212 to regenerate the geometry data 210 in order to reflect the changes to the model. Alternatively, it is possible to simply make the changes to the feature data 208 without activating the rebuild engine 212. Following the step 310, processing is complete.

Figure 25:
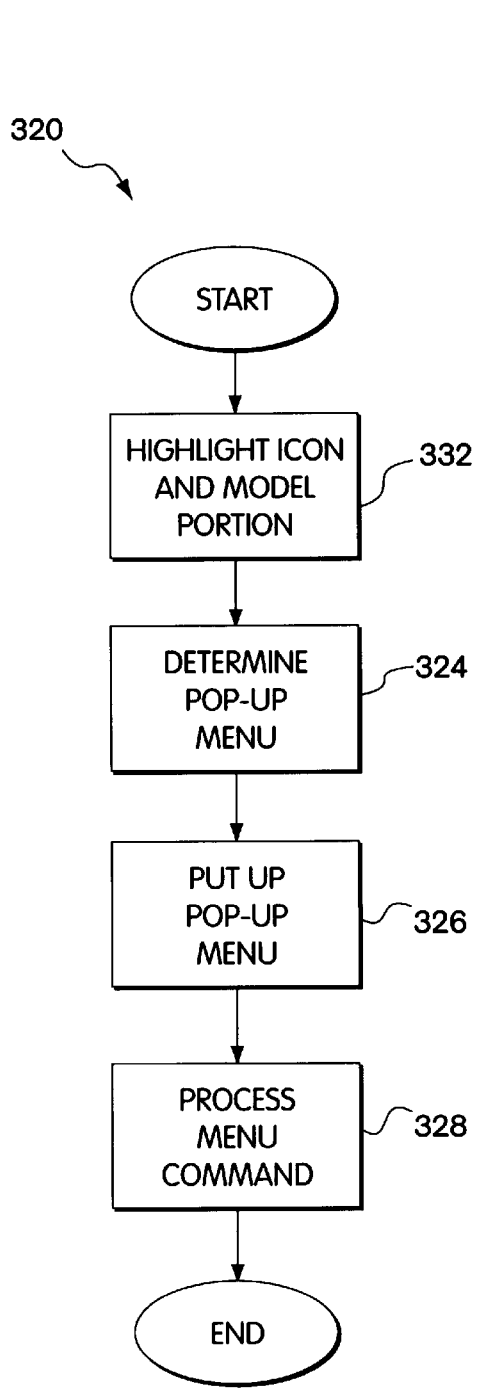
FIG. 25 is a flow chart showing processing when a user clicks the right mouse button while the mouse cursor is in the graphical browser portion of the window.

Referring to FIG. 25, a flow chart 320 illustrates in detail operations performed at the step 270 of FIG. 23 where the user clicks the right button of the mouse while the cursor of the mouse is in the graphical browser portion of the window. At a first step 322, the icon that is coincident with the cursor of the mouse is highlighted as is the portion of the model in the modeling portion of the window corresponding to the feature associated with the icon. Highlighting the icon and the model portion at the step 322 is described in more detail hereinafter.

Following step 322 is a step 324 which determines which pop-up menu to present to the user. The determination is made at the step 324 by examining the feature type to graphical browser pop-up menu map contained in the mapping data 230 and discussed above. Following the step 324 is a step 326 where the appropriate pop-up menu is presented to the user using library calls for that purpose provided with the Windows operating system and/or with the virtual tree control module 228. Following the step 326 is a step 328 where the menu commands are processed.

Examples of different menu options are given throughout the discussion of FIGS. 1–20. The decision to implement specific menu options for specific features is a design choice based on a variety of functional factors familiar to one of ordinary skill in the art. The menu options can perform conventional modeling program operations. Accordingly, use of the right mouse button within the graphical browser 204 is simply a mechanism for providing context-sensitive options to the user in a convenient fashion wherein the options are also accessible by other conventional modeling means that may be less convenient.

Figure 26:
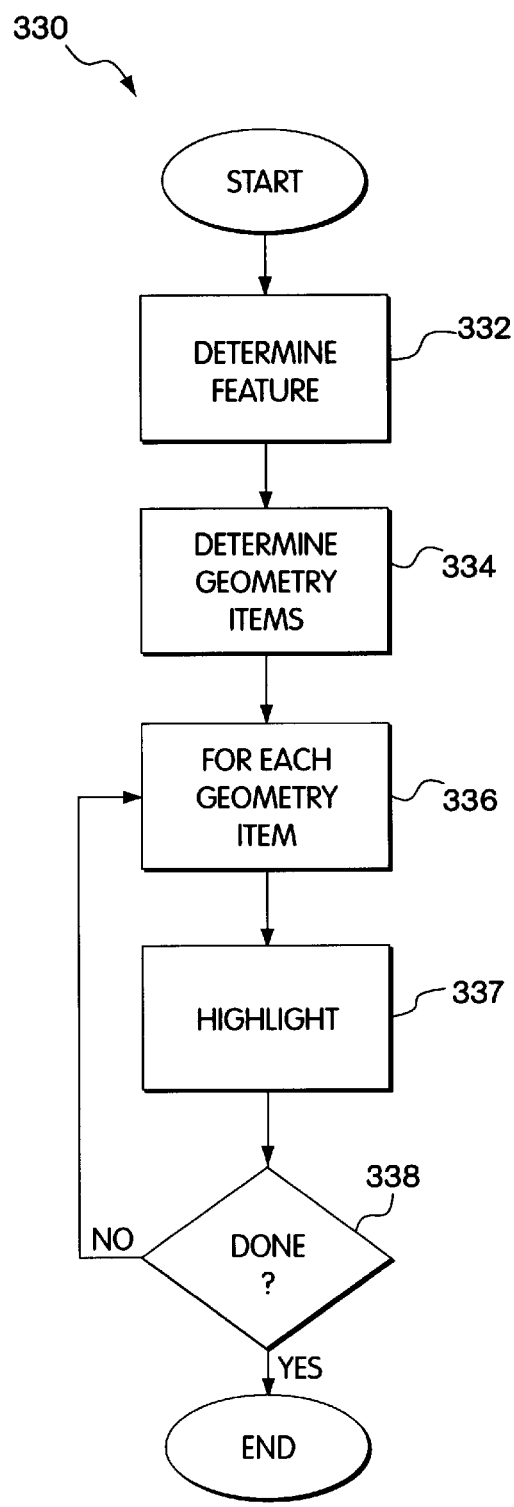
FIG. 26 is a flow chart showing processing when a user single clicks the left mouse button while the mouse cursor is in the graphical browser portion of the window.

Referring to FIG. 26, a flow chart 330 illustrates in more detail the processing associated with processing a single click of the left mouse button while the cursor of the mouse button is in the graphical browser as shown in the step 274 of FIG. 23. At a first step 332, a determination is made as to which feature from the feature data 208 corresponds to the icon of the graphical browser list that was coincident with the cursor when the user pressed the left button of the mouse. This is done by accessing the icon to feature map found in the mapping data 230. Following determination of the specific feature at the step 332 is a step 334 where the geometric data items associated with the specific feature are also determined. Note that any feature of the feature data 208 could have any number (including zero) of geometric data items associated therewith. The correlation of the feature from the feature data 208 and the geometric data items from the geometric data 210 is provided by accessing the connections data 214, discussed above, which correlates feature data 208 with geometric data 210.

Following the step 334 is a loop step 336 where a loop variable is set equal to each geometric item determined at the step 334. Following the step 336 is a step 337 where each geometric item is highlighted. The geometric items can be highlighted using any one of a number of conventional mechanisms, including displaying the highlighted geometric items in a different color than non-highlighted geometric items. Highlighting the geometric items changes the display of the modeling portion of the window. Following the step 337 is a step 338 which tests if all of the geometric items determined at the step 334 have been highlighted. If not, control transfers back up to the looping step 336 in order to loop on the next geometric item. Otherwise, if it is determined at the step 338 that all the geometric items have been highlighted, then processing is complete following the step 338. Note that the steps of the flow chart 330 can be used for highlighting at the step 322 of FIG. 25.

Figure 27:
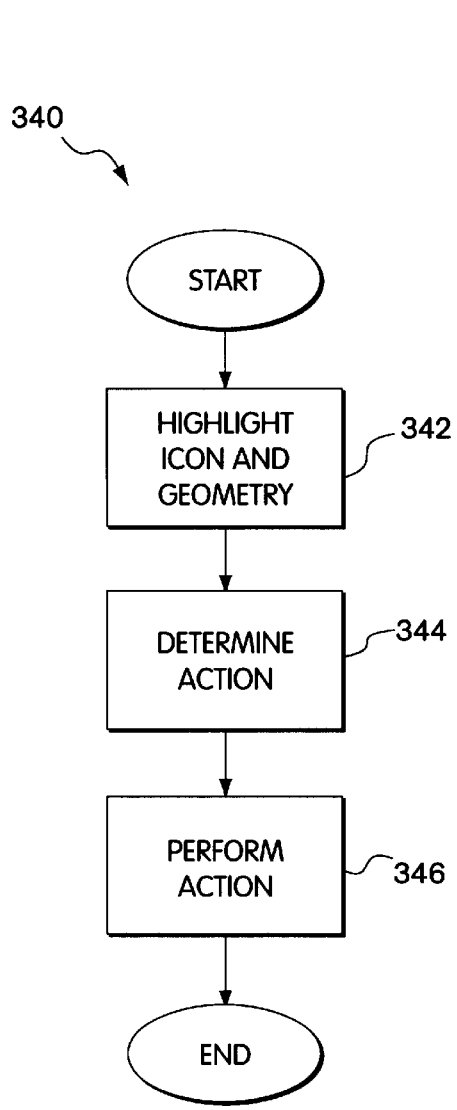
FIG. 27 is a flow chart showing processing when a user double clicks the left mouse button.

Referring to FIG. 27, a flow chart 340 illustrates in detail processing the double click of the left mouse button of the steps 276, 288 of FIG. 23. At a first step 342 the feature icon and associated geometry are highlighted in a manner similar to that described for the steps of FIG. 26. Following the step 342 is a step 344 where the action associated with double clicking the left button is determined by accessing the mapping data 230 of the graphical browser 204 to find the appropriate feature type to action correlation in order to determine which action is appropriate. Following the step 344 is a step 346 where the action is performed.

The action that is performed at the step 346 depends on the type of feature and is a design choice based on a variety of functional factors familiar to one of skill in the art. For example, it is possible for the left button double click to show dimensions of the feature, as illustrated in connection with FIG. 5 and described above. It is also possible for the system to be designed such that double clicking the left button puts the selected feature in a modifiable state.

Figure 28:
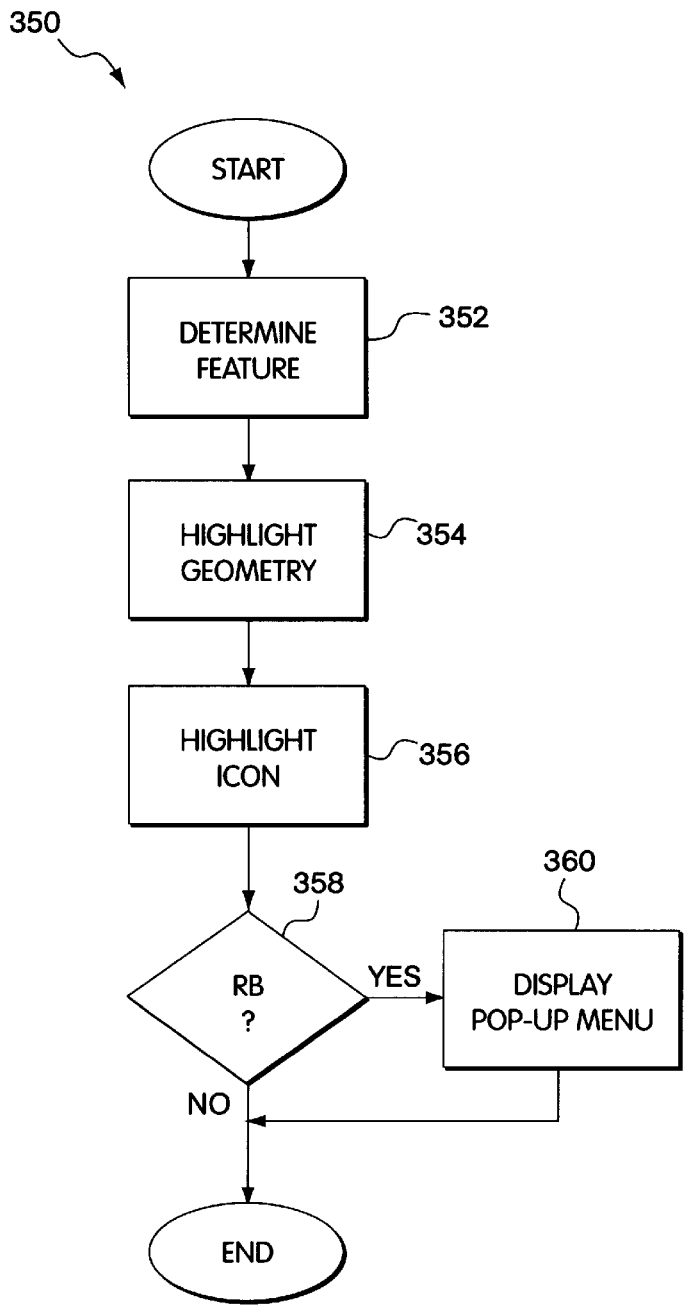
FIG. 28 is a flow chart showing processing when a user clicks the right mouse button while the cursor is in the modeling portion of the window.

Referring to FIG. 28, a flow chart 350 corresponds to the steps 282, 286 of FIG. 23 which occur, respectively, when the right button is pressed with the mouse in the modeling portion of the window and when the left button of the mouse is single clicked with the cursor of the mouse being in the modeling portion of the window. Processing begins at a first step 352 to determine the feature corresponding to the specific geometry selected by clicking the mouse button with the cursor coincident with the modeling portion. The feature is determined by accessing the connections data 214 of the model program interface 206. Given a particular geometric feature found in the geometric data 210, the connections data 214 can determine which feature or features correspond to the specific geometric data item selected by the user.

Following the step 352 is a step 354 where the geometry data items selected by clicking the mouse button are highlighted. The details and options for highlighting geometry is discussed above in connection with FIG. 26.

Following the step 352 is a step 356 where the icon(s) associated with the feature or features that correspond to the selected geometry are highlighted. That is, when the user clicks a mouse button on a portion of the model, not only is that portion of the model highlighted but so is the icon or icons corresponding to the feature or features determined at the step 352. Following the step 356 is a test step 358 which determines if the right button (as opposed to the left button) of the mouse has been clicked. If so, then control transfers from the step 358 to a step 360 where a pop-up menu is displayed. The pop-up menu associated with the specific feature is found in the mapping data 230, as described above. If, on the other hand, it is determined at the step 358 that the right button has not been pressed (and hence by inference the left button of the mouse has been pressed), then no pop-up menu is displayed. Following the step 360 or following the step 358 if the left button of the mouse is pressed, processing is complete.

Figure 29:
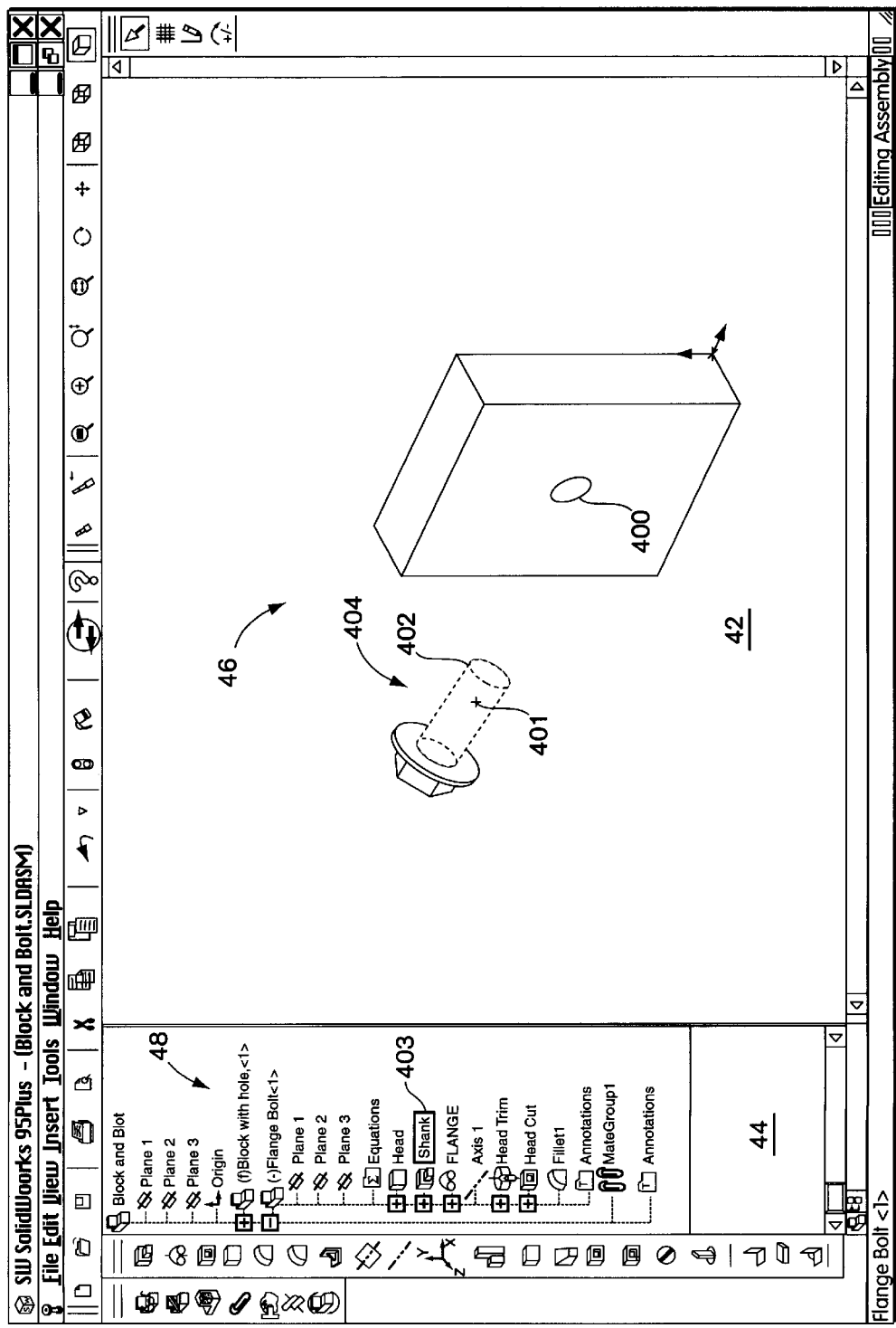
FIG. 29 is a screen shot of the operation of a dynamic mate inferencing embodiment of the invention.

In one embodiment, the invention may include a dynamic mate inferencing feature. Referring to FIG. 29, the window 40 includes the modeling portion 42 and the graphical browser portion 44. The three dimensional model 46 is displayed in the modeling portion 42 as in other embodiments depicted herein. As in other embodiments, the graphical browser portion 44 can be used to visualize and/or edit feature types, names, model structures, relationships between features, order, dates of creation and modification of features, feature suppression, feature visibility and other similar attributes of the model 46.

When preparing the model 46, the user may wish to mate one component of the model 46 with another component within an assembly; for example, referring to FIG. 29, the user may wish to insert a bolt 404 having a cylindrical shank 402 into a cylindrical hole 400. It should be recognized that the mating of the bolt 404 with hole 400 is only one illustrative example of many possible mated components, such as bolts, springs, fasteners, and the like, that have features such as holes and grooves that can be mated to other components with complementary features, such as shanks, pegs, and the like. In this embodiment, the invention automatically identifies likely candidate mating features as one component is dragged over another component using the mouse 34.

Referring still to FIG. 29, the user may select a feature by clicking the mouse 34 on the feature of the model 46 in the modeling portion 42 of the window 40. When a feature is selected, the appearance of the feature is altered in the modeling portion 42 of the window 40. For example, if the mouse 34 is positioned at the position 401 indicated in FIG. 29, the shank 402 of the bolt 404 may be displayed in dotted lines, rather than solid lines. Other methods of identifying selection of a feature, such as changes in color or shading, may be implemented within the scope of the invention. Once the component has been selected by clicking the mouse 34, or by other conventional means, the component maybe moved by dragging the mouse 34. As the component is moved near other components, such as the hole 400 of FIG. 29, the system automatically determines what set of mates, or geometric constraints, could be established between the geometries of the components that are in proximity to each other. The system dynamically makes this determination of potential mates between components in real time as the user drags the component.

The three dimensional model 46 of the modeling portion 42 may dynamically preview the resulting mating scenario that would result if the user dropped the component, for example by releasing the left button of the mouse 34 at a particular time. Thus, referring to FIG. 30, as the user drags the bolt 404 near the hole 400 while holding the left button of the mouse 34, the bolt 404 may be displayed as being inserted in the hole 400. If the user wishes to leave a component in the previewed position displayed in the window 40, the user drops the component, for example by releasing the left button of the mouse 34, into the previewed mating scenario.

Figure 30:
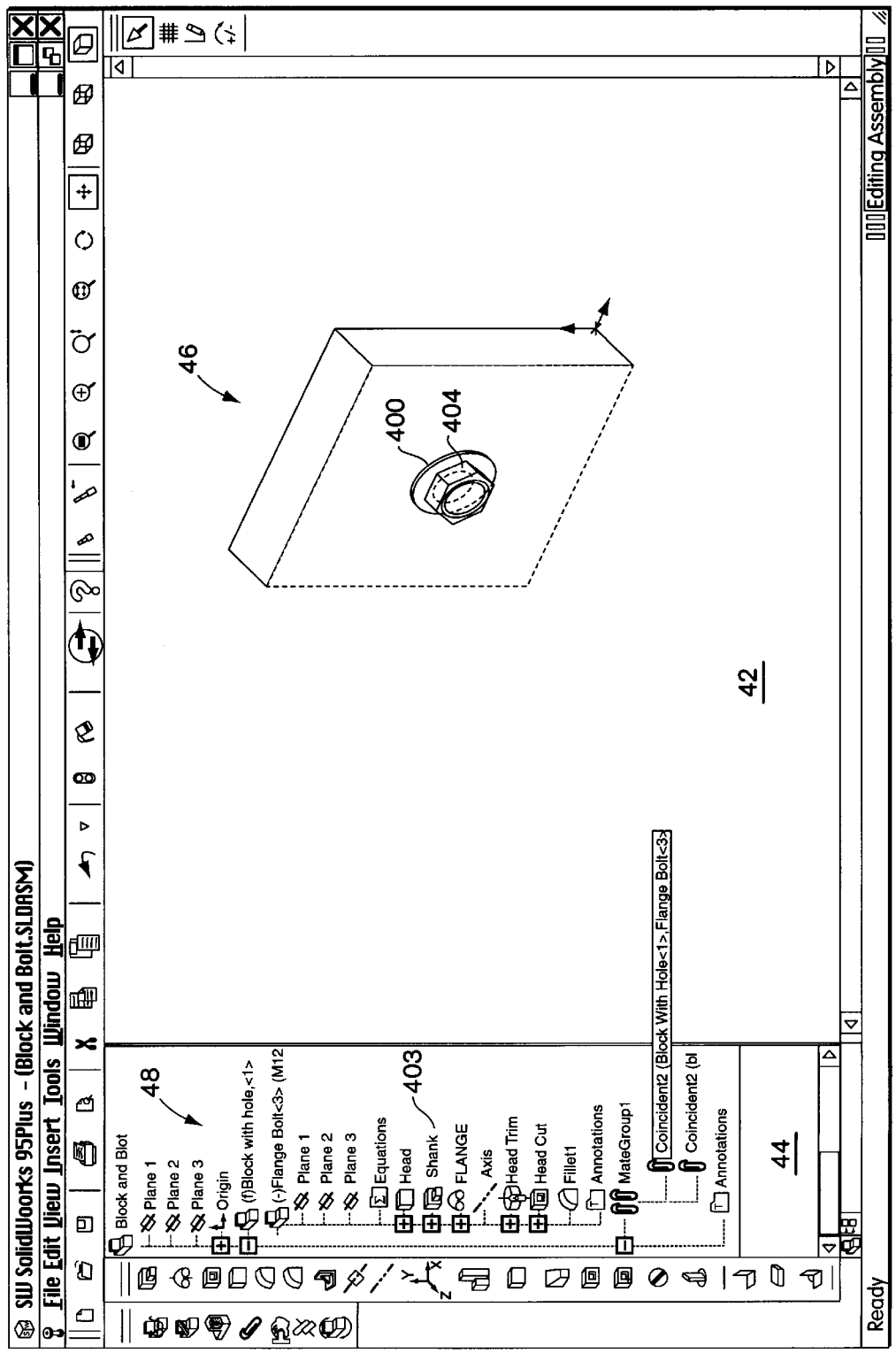
FIG. 30 is another screen shot depicting another feature of the embodiment of FIG. 29.

As depicted in FIGS. 29 and 30, the selection of a component can be made between two components within the modeling portion 42. Alternatively, a feature 403 maybe selected from the graphical browser portion 44, for example by positioning the mouse 34 over the feature 403 and clicking the left mouse button. The feature 403 can then be dragged from the graphical browser portion to the modeling portion 42, in which case the system determines a characteristic set of geometries to be mated, based on known characteristics of the feature 403 selected from the graphical browser portion 44. For example, selection of the shank feature of the flange-bolt component in the graphical browser portion 44 would result in recognition of the presence of a cylindrical face geometry, among other geometries, of the shank 403. If the user then dragged the mouse 34 near the hole 400 in the modeling portion 42, the system would dynamically display the bolt 404 as being positioned in the hole 400. By releasing the left button of the mouse 34, the user could then leave the bolt 404 in the hole 400.

Figure 31:
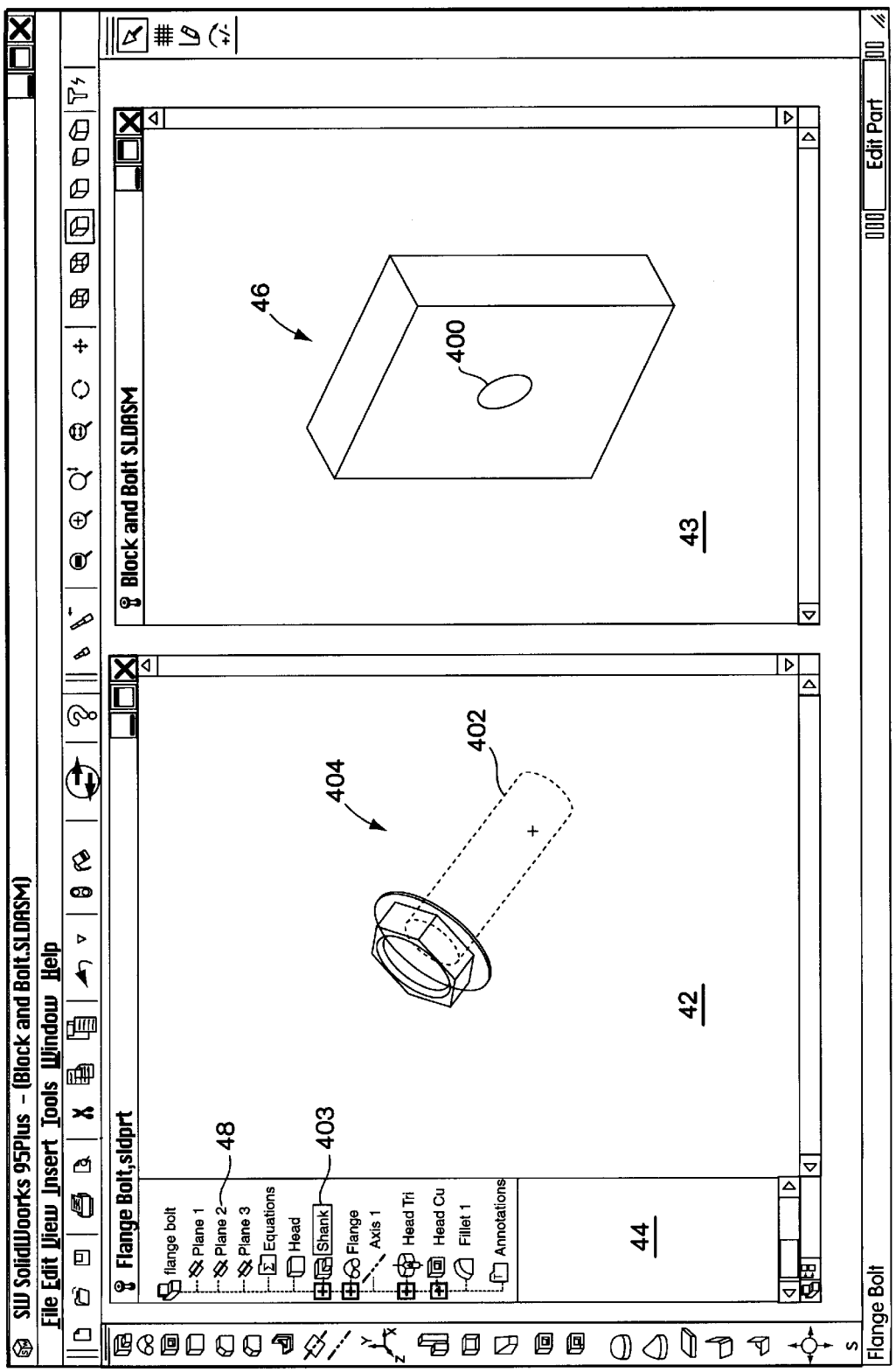
FIG. 31 is another screen shot depicting another feature of the embodiment of FIG. 29.

Referring to FIG. 31, the user may also select a component from one modeling portion 42 and drag the component, such as the bolt 404, to a second modeling portion 43, where it can be mated with a component in the second modeling portion 43. Thus, the bolt 404 with the shank 402 could be in the first modeling portion 42 and moved into, copied into, or referenced into a second modeling portion 43 to be mated with the hole 400. Similarly, features from the graphical browser portion 44 of one window could be moved into the modeling portion 43 of a second window. It should be recognized that in embodiments of the invention the selection of a component can be initiated either in the graphical browser portion 44 or in the modeling portion 42. The determination of a characteristic set and the dropping of the feature 48 can also occur in either the graphical browser 44 or the modeling portion 42, with the display of the possible mating scenarios appearing in the modeling portion 42.

It should be recognized that certain types of components may have more than one possible mating scenario. For example, a bolt could be depicted with the head above the surface of a hole, or with the head flush with the planar surface at the top of the hole 400. The system may permit the user to select between different possible mating scenarios, such as by striking the tab key while dragging a component near another component. Striking the tab key or otherwise initiating the cycling between features causes the model 46 of the modeling portion 42 to display the different mating scenarios. By releasing the left button of the mouse 34 or otherwise dropping the component, the user can select the scenario that is displayed in the modeling portion 42 at the time of selection.

In the dynamic mate inferencing embodiment of the invention, the existing component can be analyzed to define a characteristic set of geometries for that component. Thus, a bolt may include characteristic geometries of a cylinder for the shank and characteristic geometries of a plane for the face under the bolt's cap. The system can then look for complementary geometries in a different component to determine appropriate mating scenarios. The system may also take any existing component and predefine what the characteristic geometry for that component. Thus, the component can be dragged from its top level, or even from a file system, and the characteristic mating set may be predetermined without need for calculation by the system. For example, if the user expects to mate bolts with cylindrical holes, then the user could define the characteristic geometry of the bolt as the cylindrical shape of the shank, ignoring other possible features.

Figure 32:
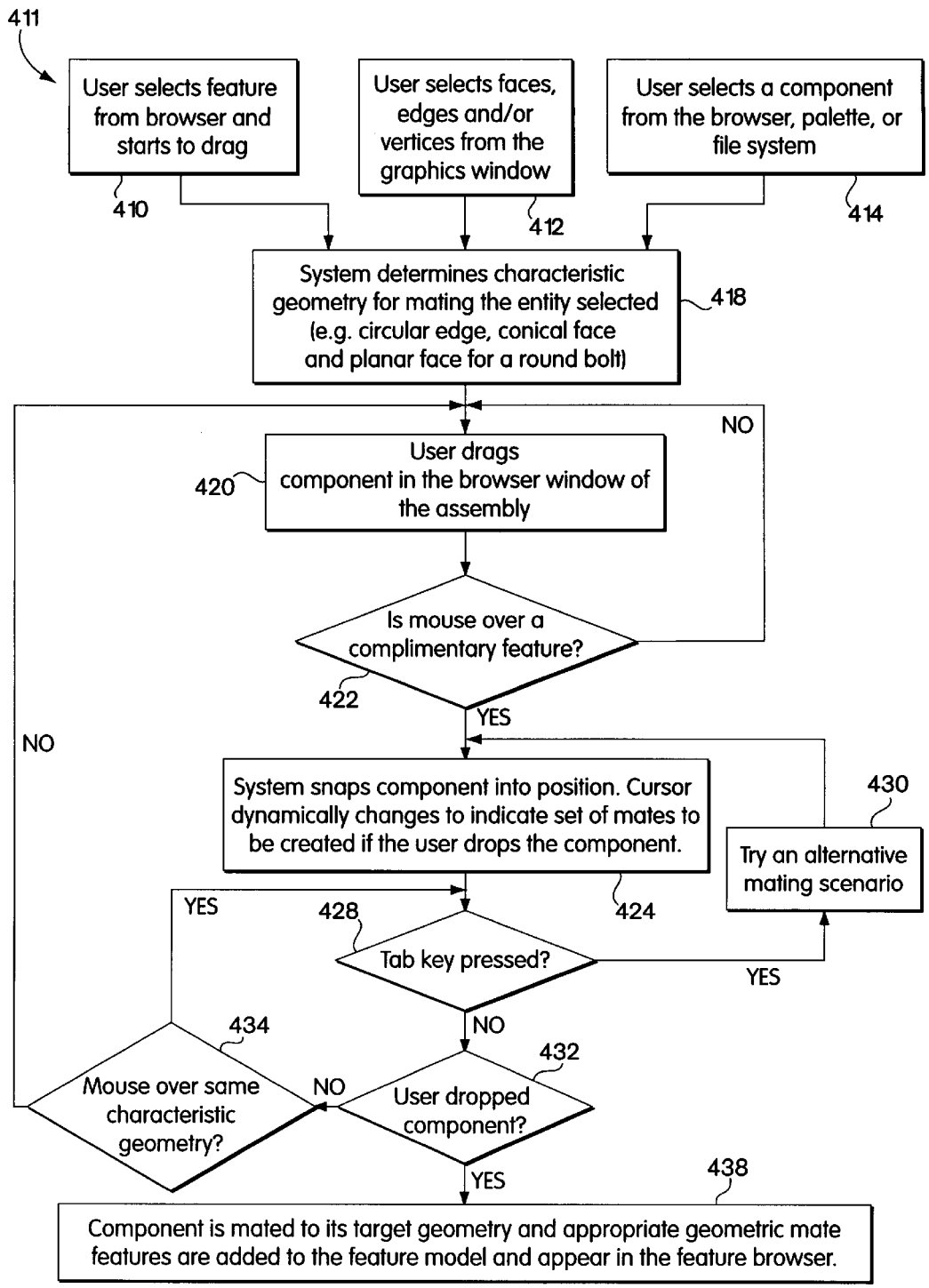
FIG. 32 is a flow chart showing processing of the dynamic mate inferencing embodiment of the invention.

Referring to FIG. 32, a flow chart 411 depicts in further detail the steps by which a user may drag a feature 48 from either the graphical browser portion 44 or the modeling portion 42 to the graphical browser portion 44. The user may initiate this feature by one of three different actions depicted in the steps 410, 412 and 414 of the flow chart 411. In the step 410, the user may select a feature from the graphical browser portion 44 and begin to drag the feature. In the step 412, the user may select faces, edges or vertices from the modeling portion 42. In the step 414 the user may select a component from the graphical browser portion 44, a pallet of components, or a file system of predetermined components. In each instance, selection may be made by clicking the left button of the mouse 34, or by other conventional means. Once the user has selected an entity in one of the steps 410, 412 or 414, the system determines at a step 418 the characteristic geometry for mating the selected entity. It should be recognized that the characteristic geometry may include multiple geometric features. For example, a round bolt would be recognized as having within its characteristic geometry, among other features, a cylindrical edge, a planar face, and a cylindrical face.

Further details as to the determination of a characteristic geometry are discussed below in connection with the discussion of FIG. 35. The system determines the characteristic geometry at the step 418 in real time, as the user drags a component. In the embodiment, depicted in FIG. 32, the user drags the component in the graphical browser portion 44 in the step 420. Next, at a step 422 the system determines whether the mouse is positioned in proximity to a complementary feature. If the mouse is not located over a complementary feature, then the system waits for the user to drag the component in the step 420 over a complementary feature. Once it is determined at a step 422 that a user has located the mouse over a complementary feature, the system snaps the component into position in a step 424, and the cursor dynamically changes to indicate the set of mates that would be created if the selected feature were dropped at that time. At the step 422, the list of features in the graphical browser portion 44 may be previewed to show the possible mating of new features.

Next, at a step 428 the user may initiate a cycle between different possible mating scenarios, by pressing the tab key or by other conventional means. If the user elects at the step 428 to see different scenarios, then at a step 430 the cursor changes to display different mating scenarios for the characteristic geometry for the selected entity. The system then returns to the step 424 in which the system dynamically previews the component, as illustrated by changing the feature set displayed by the cursor and repositioning the component, the set of mates that will be created between the selected entity and the complementary feature. If the user does not wish to select different alternative mating scenarios at the step 428, the user may drop the component at a step 432. If at the step 432 the user drops the component, then the component is mated at a step 438 to its target geometry and the appropriate geometric mate features are added to the feature model and appear in the graphical browser portion 44.

If the user does not drop the component at the step 432, then the system determines at a step 434 whether the mouse 34 is still located over the same characteristic geometry. If so, the system returns to the step 428 at which the user may select among different scenarios. If the mouse is not determined to be over the same characteristic geometry at the step 434, then the system returns to the step 420 at which the user drags the component in the graphical browser portion 44. The user then returns to the steps 420–438 described above until a component has been mated to its target geometry, ending processing at the step 438, or until the user drops the component in a position in which the component is not located over a complementary feature, also ending the dynamic mate inferencing feature of the invention.

Figure 33:
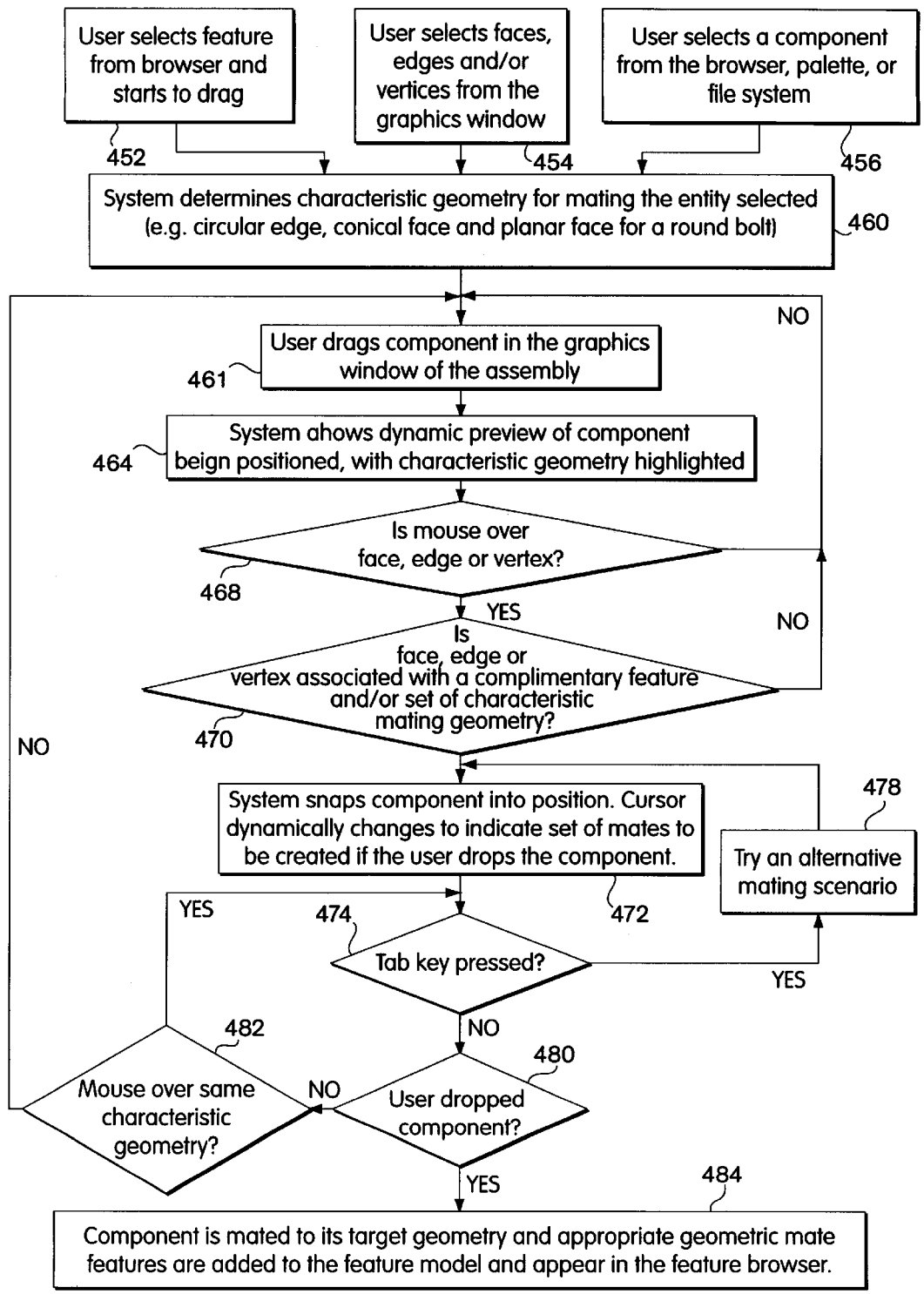
FIG. 33 is a flow chart showing further processing of the dynamic mate inferencing embodiment of the invention.

Referring to FIG. 33, a flow chart 451 depicts the steps by which a user may drag a component from the graphical browser portion 44 or the modeling portion 42 to the modeling portion 42. The steps are similar to those depicted in the flow chart 411 of FIG. 32. Dragging a component to the modeling portion 42 maybe initiated by three different steps, depicted as the steps 452, 454, 458 of the flow chart 451. First, the user may select a feature from the graphical browser portion 44 at the step 452 and begin to drag the feature 48. Alternatively, the user may select faces, edges or vertices from the modeling portion 42 at the step 454 and begin to drag the selected entity. Alternatively, the user may at the step 458 select a component from the graphical browser portion 44, from a palette of predefined components, or from a file system that includes predefined components.

Once the user has initiated the feature by one of the steps 452, 454 or 458, the system determines at a step 460 the characteristic geometry for mating the selected entity. The steps by which the system determines the characteristic geometry are explained in further detail in connection with the discussion of FIG. 35 below. As with the step 418 of the flow chart 411, the characteristic geometry may include a number of geometric features, such as a cylindrical face, circular edge, and planar face for a bolt. As the system determines the characteristic geometry, the user may drag the component in the modeling portion 42 of the window 40 in a step 461. If the entity is dragged near another component that has a complementary geometry to the characteristic geometry determined at the step 460, then at a step 464 the system shows a preview of the selected component associated with the mouse location. At a step 468 the system determines whether the mouse is located over a face, edge or vertex and at a step 470 the system determines whether the face, edge or vertex is associated with a complementary feature to the characteristic mating geometry of the selected component. If neither of these inquiries are determined to be in the affirmative at the steps 468 and 470, then the system returns to step 461 at which the user drags the component until it is located over a face, edge or vertex that is associated with a complementary feature to the characteristic geometry of the selected feature.

Once the selected component is located over a face, edge or vertex at the step 468, and the face, edge or vertex is associated with the complementary feature at the step 470, then the system snaps the component into position at a step 472. At the step 472, the cursor dynamically changes to indicate the set of mates to be created if the user drops the component, the model 46 (including the feature) is changed to dynamically preview what mates would be created. The user may at a step 474 use the tab key or other means to initiate selection among different mating scenarios. If the user wishes to select among scenarios at the step 474, then at a step 478 the system displays alternative mating scenarios. With each scenario, the system returns to the step 472 at which the system snaps the component into position to indicate the set of mates that would be created if the user drops the component.

If the user does not wish to cycle between alternative scenarios at the step 474, then the user may elect to drop the component at a step 480. If the user does not drop the component, then the system determines whether the mouse is located over the same characteristic geometry at a step 482. If so, then the user may still alternate between different scenarios by selecting the tab key at the step 474 or drop the component at the step 480. If the mouse 34 is not located over the same characteristic geometry at the step 482, then the user is returned to the step 461 at which the user may drag the component to the graphics window until the component is located over a face, edge or vertex that is associated with a complementary feature at the steps 468 and 470. The user then continues through to the step 480 as described above, at which point the user may drop the component.

If the user drops the component at the step 480, then at a step 484 the component is mated it to its target geometry and the appropriate mate features are added to the model 46 in the modeling portion 42 and to the graphical browser portion 44, completing the dynamic mate inferencing algorithm.

Figure 34:
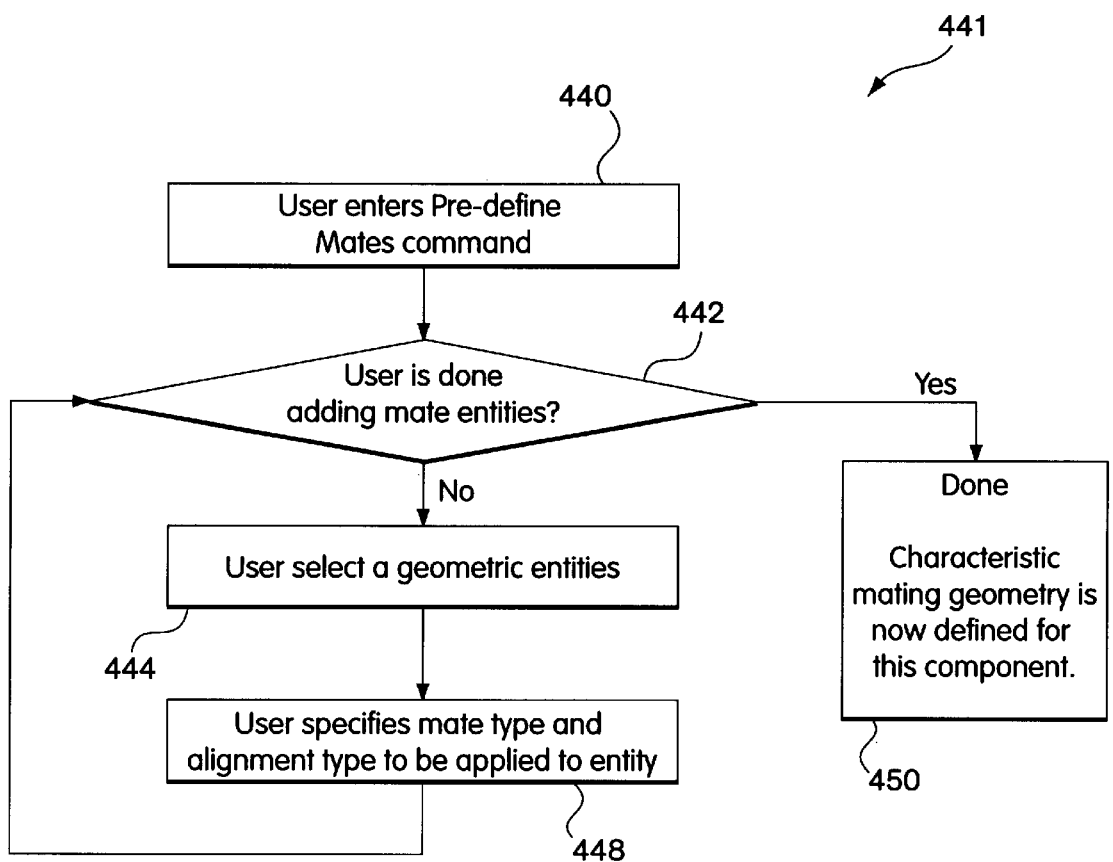
FIG. 34 is a flow chart showing further processing of the dynamic mate inferencing embodiment of the invention.

Referring to FIG. 34, the steps by which a user may predefine the characteristic geometry for mating an entity are depicted in a flow chart 441. First, at a step 440, the user enters a command, either through keyboard, a pull down menu, or other conventional means. This command, which may be called the "pre-define mates" command, transfers the user to a step 442 at which it is determined whether the user has completed adding mate entities. If user has added all mate entities desired, then the characteristic geometry is defined for the component and the algorithm is complete, as indicated at a step 450. If the user wishes to add mate entities to a particular component, then at a step 444 the user selects a geometric entity to be added. Next, at a step 448 the user specifies the mate type and the alignment type to be applied to the entity. The system then returns to a step 442 to determine whether additional entities are to be added. If so, then the user continues through the steps 444 and 448 until the user has completed adding all desired entities. Once all entities are desired, the characteristic geometry is defined for the component at the step 450.

Figure 35:
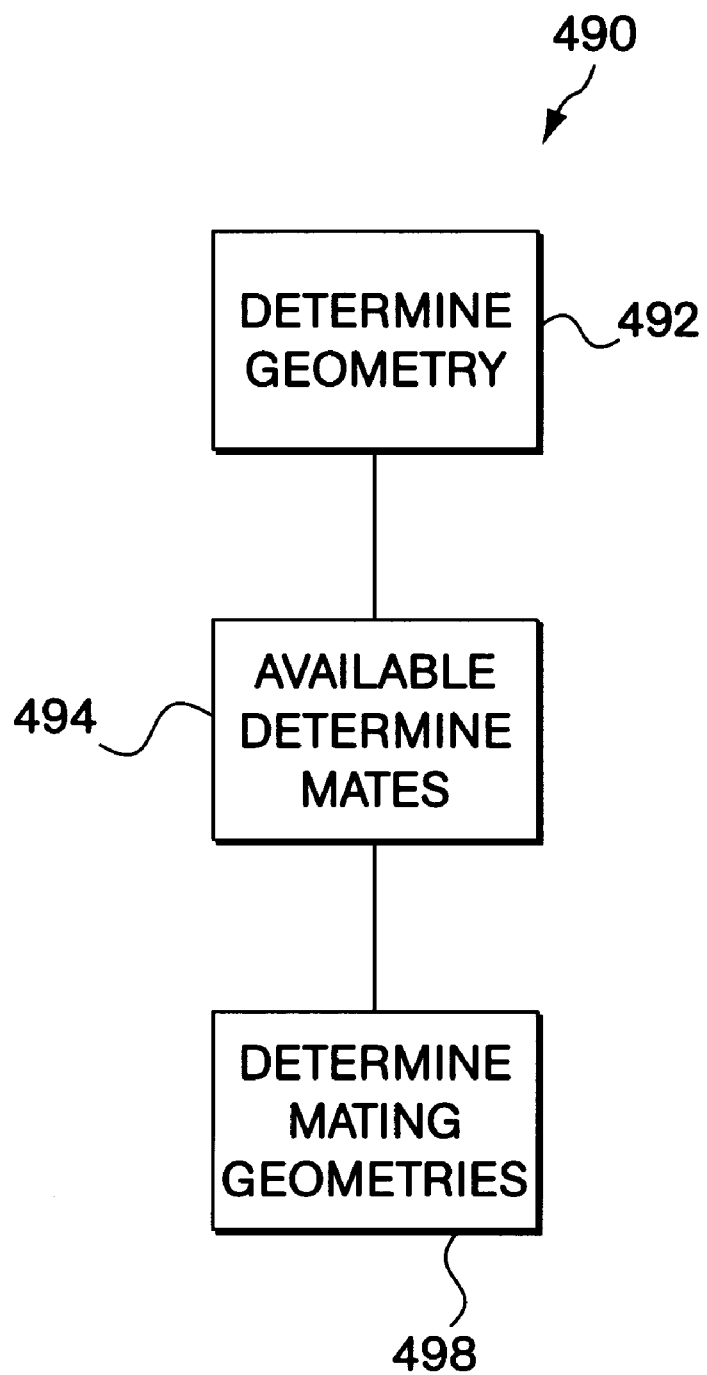
FIG. 35 is a flow chart showing further processing of the dynamic mate inferencing embodiment of the invention.

Referring to FIG. 35, the steps by which the system determines the characteristic geometries, available mate types and candidate mating geometry types in the step 418 in FIG. 32 and step 461 of FIG. 33 are depicted in a flow chart 490. The available mate types and candidate mating geometry types are subsequently used in the steps 422, 424, 430 and 438 of FIG. 32 and the steps 468, 470, 478 and 484 of FIG. 33.

First, in a step 492 the system determines the geometry of the selected feature. For example, the system may identify the feature as having a planar face, a linear edge, an axis, a vertex, a cylindrical face, or a circular edge. It should be recognized that a selected entity could have one or more of these characteristic geometries, in which case the system will permit the user to cycle between available mating types.

Next, at a step 494 the system determines the available mates for the selected geometry. This may be accomplished by a variety of programming techniques, such as use of logic tables that relate particular characteristic geometries to available mate types. For example, if a geometry is determined to include a planar face, then one characteristic mate type is coincident. If the geometry is a linear edge, the potential mates include coincident, midpoint and parallel. If the characteristic geometry is an axis, then concentric is a potential mate. Other mate types may be envisioned depending on the relevant characteristic geometry.

Next at step 498, the system determines all the possible geometries which can satisfy the mate constraints determined in the step 494 together with the geometries determined in the step 494. This may be accomplished by use of tables that identify appropriate mating geometries for selected types of mates. For example a planar face can be made coincident to another planar face, a planar edge, or a vertex. A planar face combined with a parallel constraint requires a mating geometry of either another planar face, a linear edge, an axis, or a conical face. A linear edge together with a midpoint constraint requires a point geometry.

An axis with a concentric constraint requires a circular edge or a conical face. An axis with a coincident constraint can take another axis, a linear edge or a planar face as a potential mating geometry.

A vertex with a coincident constraint could take a vertex, any edge, any face, or an axis as its mating geometry.

A cylindrical face together with a concentric constraint can take a point, linear or circular edge, or another cylindrical faces as its mating geometry.

In the example in FIG. 29, the user selects the cylindrical face of the shank feature 403 at the position 401. In the step 494 the system determines that the cylindrical face selected is one of the characteristic geometries to be mated. (The two circular edges and adjacent planar faces are also candidates.) In the step 494, the system determines that the possible mates to this face are: concentric, coincident and tangent. In the step 498 it is determined that a cylindrical face with a concentric mate constraint requires a linear edge, an axis, a point (e.g. vertex), or another cylindrical face. Thus when the mouse moves over a cylindrical face, for example, the mate can be solved and the component can be displayed in a mated state properly aligned with the other cylindrical face.

A number of special cases may be identified for particular geometries. For example, in the case of the mating of a circular edge to a face, the circular edge could be located in a coincident mate with a planar face or in a concentric mate with a cylindrical face. In this case the system may identify the edge closest to the selected point of the face as identified by the cursor. If the edge is a circular edge and both of the edges are created by intersecting a planar face and a cylindrical face, then the mate may be recognized by the system as a "peg in hole" mate. If there are circular edges on the planar face, which belong to the circular pattern of features, then the system may recognize and attempt to match pattern members. Thus, for example, circular pattern members may be matched in a concentric geometry. In particular, the system may select a particular geometry, such as the largest diameter circular edge of the selected feature, which is created by intersecting planar and cylindrical faces. This maybe accomplished in situations in which the selected geometry is determined by feature selection, rather than by the underlined geometry. In such feature-based selection, a circular edge maybe mated to a face with either a coincident mate or a concentric mate similar to those accomplished by a geometry-based mating.

Needless to say, it is not necessary that the characteristic geometries be an exact match of the corresponding mating geometries. Components may be mated provided that at least one mating relationship is established. Thus, for example, it is possible to mate a square peg with a round hole.

The system may store the available mating geometries for a particular entity and its potential mates, which permits cycling between different entities through use of the tab key as indicated in the step 428 of the flow chart, 411 of FIG. 32 and the step 474 of the flow chart and 451 of FIG. 33. Once available mates and mating geometries are established, the system may return to the step 420 of the flow chart 411 of FIG. 32 or the step 462 of the flow chart 451 of FIG. 33 at which the user drags a selected entity over other components or features of a model.

While the invention has been disclosed in connection with the preferred embodiments shown and described in detail, various modifications and improvements thereon will become readily apparent to those skilled in the art. Accordingly, the spirit and scope of the present invention is to be limited only by the following claims.

What is claimed is:

1. A system for dynamically inferencing mating of components using a computer model, comprising:

data accessing means, for accessing data indicative of features and geometric characteristics of first components and second components, with at least a portion of the first components and second components being capable of forming an assembly;

feature selection means, coupled to said data accessing means, for allowing a user to select at least one of the first components and at least one of the second components;

evaluation means, coupled to said feature selection means, for evaluating features and geometric characteristics of the selected first components and second components to determine potential mating characteristics of the first components and the second components;

inferencing means, coupled to said evaluation means, for inferencing from the mating characteristics potential mating and alignment scenarios between the selected first and second components in real time as the user drags the first component across the second component; and preview means, coupled to said feature selection means and data accessing means, for allowing the user to dynamically preview the potential mating and alignment scenarios and select a mating and alignment scenario from the potential mating and alignment scenarios to form the assembly.

2. The system of claim 1, wherein the preview means previews the potential mating and alignment scenarios in real time.

3. The system of claim 1, wherein the preview means display a plurality of potential mating and alignment scenarios between the first component and the second component.

4. The system of claim 1, further comprising:

alternate preview means, for permitting the user to alternate between different potential mating and alignment scenarios between the selected first and second components of the assembly.

5. The system of claim 1, wherein the feature selection means is in a graphical browser or in a model window.

6. The system of claim 1, further comprising:

definition means, for predefining a characteristic geometry of a component.

7. The system of claim 1, wherein the features and geometric characteristics are selected from the group consisting of faces, edges and vertices of the first and second components.

8. A method of dynamically inferencing mating of components using a computer model, comprising:

providing to a user a selection of first components;

providing to the user a selection of second components, with at least a portion of the first components and second components capable of forming an assembly;

the user selecting at least one of the first components and at least one of the second components;

the computer model automatically evaluating features and geometric characteristics of the selected first components and second components to determine potential mating characteristics of the first components and the second components;

the computer model inferencing from the mating characteristics potential mating and alignment scenarios between the selected first and second components in real time as the user drags the first component across the second component; and the user dynamically previewing the potential mating and alignment scenarios and selecting a mating and alignment scenario from the potential mating and alignment scenarios to form the assembly.

9. The method of claim 8, wherein dynamically previewing and selecting the mating and alignment scenario occurs in real time.

10. The method of claim 8, further comprising:

allowing the user to alternate between different mating and alignment scenarios between the selected first and second component of the assembly.

11. The method of claim 8, wherein the features and geometric characteristics are selected from the group consisting of faces, edges and vertices of the first and second components.

12. A computer program, residing on a computer-readable medium, for dynamically inferencing mating of components, the computer program comprising instructions for causing a computer to:

provide to a user a selection of first components;

provide to the user a selection of second components, with at least a portion of the first components and second components capable of forming an assembly;

enable the user to select at least one of the first components and at least one of the second components;

automatically evaluate features and geometric characteristics of the selected first components and second components to determine potential mating characteristics of the first components and the second components;

inference from the mating characteristics potential mating and alignment scenarios between the selected first and second components in real time as the user drags the first component across the second component; and enable the user to dynamically preview the potential mating and alignment scenarios and select a mating and alignment scenario from the potential mating and alignment scenarios to form the assembly.

* * * * *

UNITED STATES PATENT AND TRADEMARK OFFICE
CERTIFICATE OF CORRECTION

PATENT NO. : 6,219,049 B1
DATED : April 17, 2001
INVENTOR(S) : Zuffante et al.

Page 1 of 1

It is certified that error appears in the above-identified patent and that said Letters Patent is hereby corrected as shown below:

<u>Title page,</u>
Item [75], Inventor, the second inventor's name should be spelled -- Jon --, instead of "John", and the fifth inventor's last name should be spelled -- Kellman --, instead of "Kallman".

Signed and Sealed this

Nineteenth Day of February, 2002

Attest:

Attesting Officer

JAMES E. ROGAN
*Director of the United States Patent and Trademark Office*